US012676622B2

(12) United States Patent
Galton

(10) Patent No.: US 12,676,622 B2
(45) Date of Patent: Jul. 7, 2026

(54) ADAPTIVE CANCELLATION OF INTER-SYMBOL INTERFERENCE IN HIGH-SPEED CONTINUOUS-TIME DIGITAL-TO-ANALOG CONVERTERS

(71) Applicant: The Regents of the University of California, Oakland, CA (US)

(72) Inventor: Ian Andrew Galton, Del Mar, CA (US)

(73) Assignee: The Regents of the University of California, Oakland, CA (US)

( * ) Notice: Subject to any disclaimer, the term of this patent is extended or adjusted under 35 U.S.C. 154(b) by 98 days.

(21) Appl. No.: 18/891,795

(22) Filed: Sep. 20, 2024

(65) Prior Publication Data

US 2025/0105852 A1     Mar. 27, 2025

Related U.S. Application Data

(60) Provisional application No. 63/584,540, filed on Sep. 22, 2023.

(51) Int. Cl.
H03M 1/06          (2006.01)

(52) U.S. Cl.
CPC ................................ H03M 1/0604 (2013.01)

(58) Field of Classification Search
CPC .... H03M 1/0604; H03M 1/66; H03M 1/0626; H03M 1/06; H03M 1/0673
See application file for complete search history.

(56) References Cited

U.S. PATENT DOCUMENTS 4,843,392 A * 6/1989 Gulczynski ......... H03M 1/0675
                                                341/145
5,684,482 A * 11/1997 Galton ................ H03M 1/0668
                                                341/144
(Continued)

OTHER PUBLICATIONS

J. Remple and I. Galton, The Effects of Inter-Symbol Interference in Dynamic Element Matching DACs, IEEE Transactions on Circuits and Systems I: Regular Papers, vol. 64, No. 1, p. 14 23, Jan. 2017, in 10 pages.

(Continued)

*Primary Examiner* — Lam T Mai
(74) *Attorney, Agent, or Firm* — Stanek Lemon Crouse & Meeks, PA

(57)          ABSTRACT
Some embodiments of the present disclosure include a digital-to-analog conversion system configured to reduce inter-symbol interference (ISI) in high-speed continuous-time DACs. The system can include a main DAC with multiple sub-DACs, each configured to process a portion of a digital input sequence and generate part of an output waveform. To address ISI errors introduced by the sub-DACs, the system can include an ISI mitigation feedback loop. The ISI mitigation feedback loop can include an analog-to-digital converter (ADC) that generates a digital sequence from the output waveform and an analog correction signal generated by a correction DAC. A fractional decimation filter can be used to adjust a sampling rate and attenuate high-frequency components. A digital error estimator can generate an error cancellation sequence by correlating encoder information with the input sequence. The correction DAC can use the error cancellation sequence to generate the analog correction signal.

20 Claims, 7 Drawing Sheets

(56) References Cited

U.S. PATENT DOCUMENTS

| | | | | |
|---|---|---|---|---|
| 6,466,147 B1 * | 10/2002 | Jensen | H03M 1/0673 | 341/143 |
| 8,604,959 B2 * | 12/2013 | Wyville | H03M 1/661 | 341/145 |
| 9,007,250 B1 * | 4/2015 | Jeraj | H03M 1/662 | 341/145 |
| 10,020,817 B1 * | 7/2018 | Zhang | H03M 3/38 | |
| 10,250,272 B2 * | 4/2019 | Zhu | H03M 1/66 | |
| 10,340,933 B1 * | 7/2019 | Hovakimyan | H03M 1/1009 | |
| 10,461,764 B1 * | 10/2019 | Paro Filho | H03M 1/1033 | |
| 11,539,371 B1 * | 12/2022 | Tang | H03M 1/1061 | |
| 2005/0001747 A1 * | 1/2005 | Kuyel | H03M 1/1038 | 341/118 |
| 2005/0052301 A1 * | 3/2005 | Mills | H03M 1/0643 | 341/144 |
| 2005/0156773 A1 * | 7/2005 | Galton | H03M 1/0673 | 341/131 |
| 2008/0150773 A1 * | 6/2008 | Arais | H03M 3/388 | 341/120 |
| 2010/0109924 A1 * | 5/2010 | Cho | H03M 1/0695 | 341/118 |
| 2011/0006934 A1 * | 1/2011 | Katsis | H03M 1/70 | 341/137 |
| 2012/0194369 A1 * | 8/2012 | Galton | H03M 3/388 | 341/120 |
| 2015/0048960 A1 * | 2/2015 | Zhu | H03M 1/66 | 341/144 |
| 2015/0102949 A1 * | 4/2015 | Rajasekhar | H03M 1/08 | 341/118 |
| 2015/0288379 A1 * | 10/2015 | Silva | H03M 3/352 | 341/118 |
| 2016/0134302 A1 * | 5/2016 | Schafferer | H03M 3/458 | 341/120 |
| 2018/0091164 A1 * | 3/2018 | Zhu | H03M 1/08 | |
| 2020/0028519 A1 * | 1/2020 | Hsiao | H03M 1/067 | |
| 2020/0389180 A1 * | 12/2020 | Bal | H03M 3/344 | |
| 2023/0097708 A1 * | 3/2023 | Mahmoudidaryan | H03M 1/661 | 341/144 |
| 2023/0238974 A1 * | 7/2023 | Rutten | H03M 1/0621 | 341/118 |
| 2024/0213992 A1 * | 6/2024 | Gruber | H03M 1/662 | |

OTHER PUBLICATIONS

J. Remple, A. Panigada, and I. Galton, An ISI Scrambling Technique for Dynamic Element Matching Current-Steering DACs, IEEE Journal of Solid State-Circuits, vol. 57, No. 2, pp. 465-479, Feb. 2022, in 15 pages.

D. Kong and I. Galton, Subsampling Mismatch Noise Cancellation for High-Speed Continuous-Time DACs, IEEE Transactions on Circuits and Systems I: Regular Papers, vol. 66, No. 8, pp. 2843 2853, Aug. 2019, in 11 pages.

D. Kong and I. Galton, Adaptive Cancellation of Static and Dynamic Mismatch Error in Continuous-Time DACs, IEEE Transactions on Circuits and Systems I: Regular Papers, vol. 65, No. 2, pp. 421 433, Feb. 2018, in 13 pages.

D. Kong, K. Rivas-Rivera and I. Galton, A 600 MS/s DAC with over 87dB SFDR and 77dB peak SNDR Enabled by Adaptive Cancellation of Static and Dynamic Mismatch Error, IEEE Journal of Solid-State Circuits, vol. 54, No. 8, pp. 2219 2229, Aug. 2019, in 11 pages.

K. L. Chan, J. Zhu, and I. Galton, Dynamic Element Matching to Prevent Nonlinear Distortion From Pulse-Shape Mismatches in High-Resolution DACs, IEEE Journal of Solid-State Circuits, vol. 43, No. 9, p. 2067 2078, Sep. 2008, in 12 pages.

L. Chan, N. Rakuljic, and I. Galton, Segmented Dynamic Element Matching for High-Resolution Digital-to-Analog Conversion, IEEE Transactions on Circuits and Systems I: Regular Papers, vol. 55, No. 11, pp. 3383 3392, Dec. 2008, in 10 pages.

* cited by examiner

ADAPTIVE CANCELLATION OF INTER-SYMBOL INTERFERENCE IN HIGH-SPEED CONTINUOUS-TIME DIGITAL-TO-ANALOG CONVERTERS

RELATED APPLICATIONS

Any and all applications for which a foreign or domestic priority claim is identified in the Application Data Sheet as filed with the present application are incorporated by reference under 37 CFR 1.57 and made a part of this specification. This application claims priority to U.S. Provisional Patent Application No. 63/584,540, entitled "ADAPTIVE CANCELLATION OF INTER-SYMBOL INTERFERENCE IN HIGH-SPEED CONTINUOUS-TIME DACS," filed Sep. 22, 2023, which is hereby incorporated by reference.

STATEMENT OF GOVERNMENT SUPPORT

This invention was made with government support under Grant No. 1909678 awarded by the National Science Foundation. The government has certain rights in the invention.

FIELD

The present application relates to digital-to-analog converters (DACs) and, more specifically, to specifically to mitigating inter-symbol interference (ISI) in high-speed continuous-time DACs.

BACKGROUND

DACs convert digital data into analog signals for applications such as communications, audio, and video processing. High-speed DACs are designed to operate at very high data rates, suitable for applications that require rapid and precise signal conversion, such as high-frequency communication systems and advanced instrumentation. High-speed DACs can transform sequences of digital input values into continuous-time analog output waveforms. Continuous-time signals can be smooth and uninterrupted, representing the rapid sequence of digital inputs over time. This process can be important for applications that demand high fidelity and precision in signal representation.

A challenge in high-speed DACs can be ISI, where the output signal for a given digital input value can be affected by previous input values. In some cases, ISI can occur due to non-ideal circuit behaviors, including parasitic capacitances and timing mismatches, which can cause deviations in the amplitude or shape of the output pulses. These deviations can lead to errors in the analog output signal, reducing the overall performance and accuracy of the DAC.

SUMMARY

Certain illustrative examples are described in the following numbered clauses:

Clause 1. A digital-to-analog conversion system configured to reduce ISI, the digital-to-analog conversion system comprising:

a main DAC comprising a plurality of sub-DACs, each sub-DAC configured to receive a respective portion of a digital input sequence and generate a respective portion of an output waveform of the main DAC, wherein each sub-DAC has unique characteristics that introduce ISI error in the output waveform; and an ISI mitigation feedback loop configured to adaptively at least partially cancel the ISI error in the output waveform introduced by the sub-DACs, the ISI mitigation feedback loop comprising:

an analog-to-digital converter (ADC) configured to generate a digital sequence based on the output waveform of the main DAC and an analog correction signal generated by a correction DAC;

a fractional decimation filter configured to process the digital sequence by modifying a sampling rate and attenuating high-frequency components;

a digital error estimator configured to provide an error cancellation sequence, the digital error estimator comprising an ISI estimator, the ISI estimator comprising a plurality of sub-ISI estimators, wherein outputs of the plurality of sub-ISI estimators are combined to form an output of the ISI estimator, wherein each sub-ISI estimator is configured to:

generate first and second digital encoder information sequences comprising a plurality of values, wherein each value of each sequence is derived from a state of a digital encoder of the main DAC, and wherein the first and second digital encoder information sequences correspond to activity and timing of the sub-DACs, correlate the first digital encoder information sequence against a digital input sequence provided to the ISI estimator, to estimate impulse response coefficients for a subsequent finite impulse response (FIR) filter, and perform FIR filtering on the second digital encoder information sequence using the impulse response coefficients; and the correction DAC configured to receive the error cancellation sequence from the digital error estimator and generate the analog correction signal, wherein the analog correction signal corresponds to ISI error components.

Clause 2. The digital-to-analog conversion system of clause 1, wherein the digital encoder is a dynamic element matching (DEM) encoder.

Clause 3. The digital-to-analog conversion system of clause 2, wherein the DEM encoder generates digital switching sequences that correspond to activity and timing of the sub-DACs, and wherein the first digital encoder information sequence is derived from the digital switching sequences.

Clause 4. The digital-to-analog conversion system of any of the preceding clauses, wherein to estimate the impulse response coefficients, each sub-ISI estimator is further configured to correlate one or more delayed versions of the first digital encoder information sequence against the digital input sequence provided to the ISI estimator.

Clause 5. The digital-to-analog conversion system of any of the preceding clauses, wherein the digital error estimator further comprises a mismatch error estimator configured to reduce static and/or dynamic error arising from undesired deviations from nominal component characteristics and clock skew, wherein the ISI estimator and the mismatch error estimator are configured to operate concurrently and share analog circuitry without significant mutual interference.

Clause 6. The digital-to-analog conversion system of any of the preceding clauses, wherein each of the sub-DACs is a 1-bit DAC.

Clause 7. The digital-to-analog conversion system of any of the preceding clauses, wherein the ISI mitigation feedback loop is configured to at least partially cancel the ISI error components, and wherein the ISI error components are within a first Nyquist band of the DAC.

Clause 8. The digital-to-analog conversion system of any of the preceding clauses, wherein the ISI mitigation feedback loop is configured to perform foreground calibration during an initialization phase, the foreground calibration comprising applying a predetermined input sequence to the main DAC to expedite convergence of adaptive FIR filter coefficients before transitioning to normal operation.

Clause 9. The digital-to-analog conversion system of any of the preceding clauses, wherein the ISI mitigation feedback loop is configured to perform background calibration during normal operation to adjust adaptive FIR filter coefficients in real-time to compensate for variations in temperature and other environmental conditions.

Clause 10. The digital-to-analog conversion system of any of the preceding clauses, wherein each sub-ISI estimator is configured to receive a current digital input value and a previous digital input value provided to the respective sub-DAC, and to generate the second digital encoder information sequence by calculating a product of the current digital input value with the previous digital input value.

Clause 11. The digital-to-analog conversion system of any of the preceding clauses, wherein each sub-ISI estimator is configured to generate the first digital encoder information sequence by processing switching sequences generated by the digital encoder, wherein the switching sequences correspond to operational states of the respective sub-DACs and are combined to form the first digital encoder information sequence.

Clause 12. A method for reducing ISI in a digital-to-analog conversion system, the method comprising:

receiving, at a main DAC comprising a plurality of sub-DACs, a digital input sequence, each sub-DAC configured to receive a respective portion of the digital input sequence and generate a respective portion of an output waveform of the main DAC, wherein each sub-DAC has unique characteristics that introduce ISI error in the output waveform;

generating an error cancellation sequence using a digital error estimator, wherein the generating comprises:

generating first and second digital encoder information sequences, each comprising a plurality of values derived from a state of a digital encoder within the main DAC, wherein the first and second digital encoder information sequences correspond to activity and timing of the sub-DACs, correlating the first digital encoder information sequence against the digital input sequence to estimate impulse response coefficients for a subsequent FIR filter, and performing FIR filtering on the second digital encoder information sequence using the impulse response coefficients to generate the error cancellation sequence;

generating, based on the error cancellation sequence, an analog correction signal that corresponds to ISI error components; and generating a digital sequence based on the analog correction signal and the output waveform of the main DAC.

Clause 13. The method of clause 12, wherein the digital encoder is a DEM encoder, wherein the DEM encoder generates switching sequences that correspond to activity and timing of the sub-DACs, and wherein the first digital encoder information sequence is derived from the switching sequences.

Clause 14. The method of clause 12, wherein estimating the impulse response coefficients comprises correlating one or more delayed versions of the first digital encoder information sequence against the digital input sequence.

Clause 15. The method of clause 12, wherein each of the sub-DACs is a 1-bit DAC.

Clause 16. The method of clause 12, further comprising performing a foreground calibration during an initialization phase, the foreground calibration comprising applying a predetermined input sequence to the main DAC to expedite convergence of adaptive finite impulse response (FIR) filter coefficients before transitioning to normal operation.

Clause 17. The method of clause 12, further comprising performing a background calibration during normal operation, the background calibration comprising adjusting the adaptive finite impulse response (FIR) filter coefficients in real-time to compensate for variations in temperature and other environmental conditions.

Clause 18. The method of clause 12, further comprising receiving, at each sub-ISI estimator, a current digital input value and a previous digital input value provided to the corresponding sub-DAC, and generating the second digital encoder information sequence by calculating a product of the current digital input value with the previous digital input value.

Clause 19. The method of clause 12, further comprising generating the first digital encoder information sequence by processing switching sequences generated by the digital encoder, wherein the switching sequences correspond to operational states of the respective sub-DACs and are combined to form the second digital encoder information sequence.

Clause 20. A digital-to-analog conversion system configured to reduce ISI in a main DAC, the digital-to-analog conversion system comprising:

an ISI mitigation feedback loop configured to adaptively at least partially cancel ISI error in an output waveform of the main DAC, wherein the main DAC comprises a plurality of sub-DACs, each sub-DAC configured to receive a respective portion of a digital input sequence and generate a respective portion of the output waveform, wherein each sub-DAC has unique characteristics that introduce the ISI error in the output waveform, and wherein the ISI mitigation feedback loop comprises:

an ADC configured to generate a digital sequence based on the output waveform of the main DAC and an analog correction signal generated by a correction DAC;

a fractional decimation filter configured to process the digital sequence by modifying a sampling rate and attenuating high-frequency components;

a digital error estimator configured to provide an error cancellation sequence, the digital error estimator comprising an ISI estimator, the ISI estimator comprising a plurality of sub-ISI estimators, wherein outputs of the plurality of sub-ISI estimators are combined to form an output of the ISI estimator, wherein each sub-ISI estimator is configured to:

generate first and second digital encoder information sequences comprising a plurality of values, wherein each value of each sequence is derived from a state of a digital encoder of the main DAC, and wherein the first and second digital encoder information sequences correspond to activity and timing of the sub-DACs, correlate the first digital encoder information sequence against a digital input sequence provided to the ISI estimator, to estimate impulse response coefficients for a subsequent FIR filter, and perform FIR filtering on the second digital encoder information sequence using the impulse response coefficients; and the correction DAC configured to receive the error cancellation sequence from the digital error estimator and generate the analog correction signal, where the analog correction signal corresponds to ISI error components.

DETAILED DESCRIPTION

Figure 1:
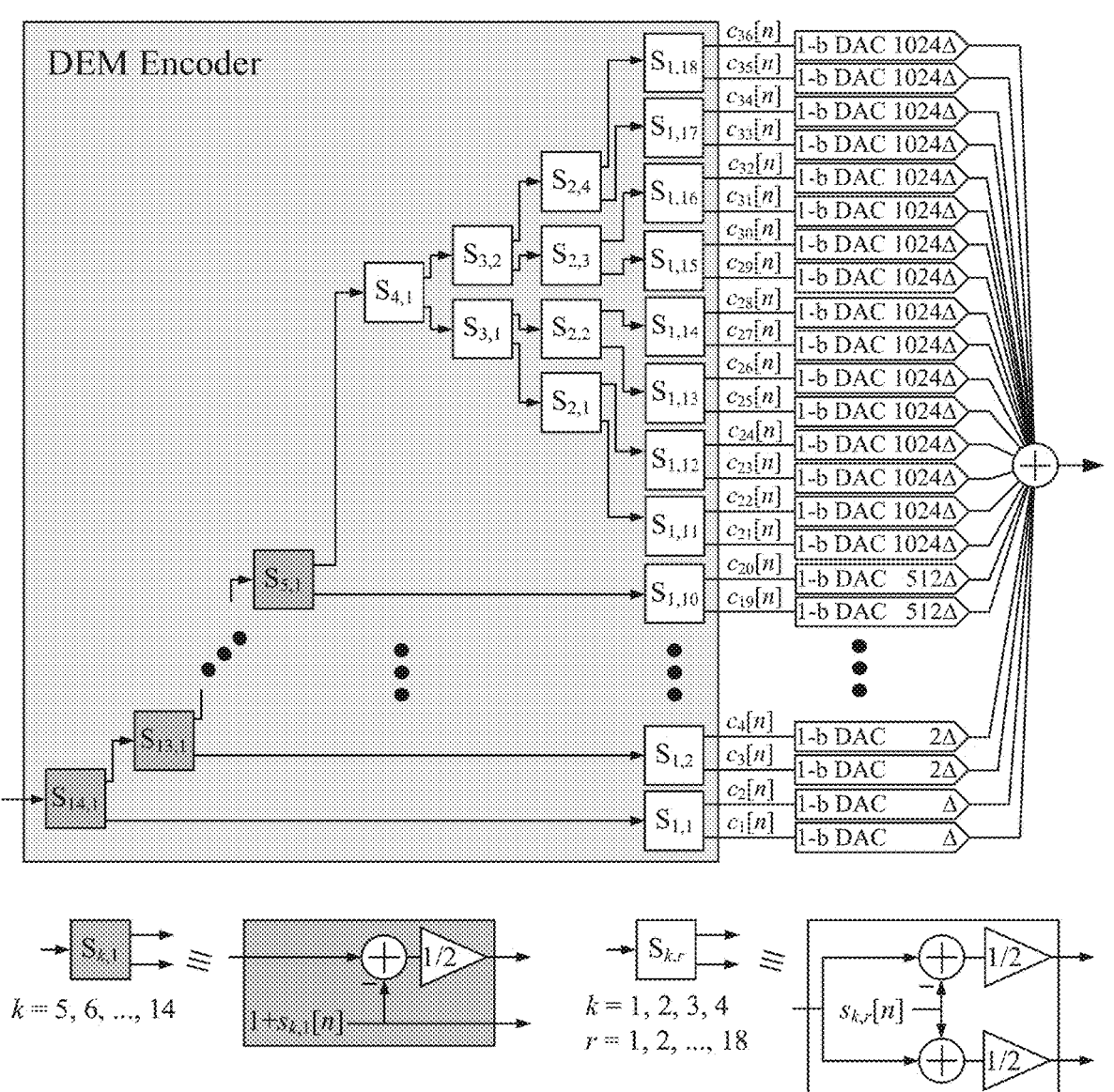
FIG. 1 shows a schematic representation of an example 14-bit DEM DAC, including 36 1-bit DACs, orchestrated by an all-digital DEM encoder that includes a tree of 35 switching blocks. The figure also delineates the functional relationships between the input sequence, DEM encoder, and output waveform in accordance with equations and principles outlined herein.

Although certain embodiments and examples are described herein, it will be understood that the disclosure extends beyond the specifically disclosed embodiments and/or uses and obvious modifications and equivalents thereof. Thus, it is intended that the scope of the disclosure herein disclosed should not be limited by any particular embodiments described herein.

A continuous-time DAC converts a sequence of digital input values represented as digital codewords into a continuous-time analog output waveform. Over each of the DAC's clock periods, the continuous-time output waveform can be viewed as an analog pulse with a duration less than or equal to the DAC's clock period. Ideally, the amplitude of each pulse is proportional to the value of the corresponding input codeword, but otherwise the pulses all have the same shape.

Nonideal circuit behavior can cause deviations in the pulse amplitudes from their ideal values and deviations in the shapes of the pulses from one clock period to another. The error in the DAC's output waveform resulting from pulse amplitude deviations can be referred to as "static error," whereas that resulting from pulse shape deviations can be referred to as "dynamic error." ISI is often a major source of dynamic error in continuous-time DACs. ISI can be the result of parasitic capacitances which cause the amplitude and/or shape of each output pulse to depend on prior input codeword values as well as the current input codeword value.

Various ISI mitigation techniques can fall into three categories: ISI spectral shaping or scrambling techniques, calibration techniques, and return-to-zero (RZ) pulse shaping. ISI spectral shaping or scrambling techniques can improve the DAC's spurious-free dynamic range (SFDR) at the expense of significantly reduced signal-to-noise ratio (SNR), or can be applicable only to oversampling DACs. ISI calibration techniques for Nyquist-rate current-steering DACs can be restricted to foreground operation and can require manual calibration using off-chip laboratory spectrum analyzers, or can only partially reduce ISI errors, or can mitigate nonlinear distortion at the expense of high residual noise. RZ pulse shaping, wherein the DAC's constituent circuit blocks are reset to signal-independent states by the end of each clock period, can be an effective means of mitigating ISI. However, RZ DACs, i.e., DACs that incorporate RZ pulse shaping, can be significantly more sensitive to clock jitter than their non-return-to-zero (NRZ) counterparts, particularly at high clock rates, and can typically consume more than twice the power of comparable NRZ DACs. Dual RZ pulse shaping can be used to address the increased sensitivity to clock jitter, but doing so can further double the power consumption.

Some inventive concepts described herein can address these or other problems, and/or can enhance the performance of digital-to-analog conversion systems by introducing a dynamic approach for addressing ISI in high-speed, continuous-time DACs. The techniques discussed herein can implement an ISI mitigation feedback loop that adaptively responds to and mitigates ISI errors introduced by a main DAC. This approach can reduce the reliance on traditional techniques, such as RZ pulse shaping, which can increase sensitivity to clock jitter and potentially raise power consumption.

General DAC Equations

An NRZ DAC converts a discrete-time sequence of digital codewords into a continuous-time output waveform, $y(t)$. The input codeword sequence can be interpreted as a sequence of numerical input values, $x[n]$, the nth of which denotes the ideal value of $y(t)$ over nth clock period. For the case of a symmetric-about-zero M+1-level NRZ DAC, $x[n]$ is restricted to the set of values $\{-M\Delta/2, -M\Delta/2+\Delta, -M\Delta/2+2\Delta, \ldots, M\Delta/2\}$ where $\Delta$ is the DAC's minimum step-size. In the absence of non-ideal circuit behavior, the DAC's output waveform can be written as $y(t)=x[n]$, where $n_t=\lfloor f_s t \rfloor$, i.e., $n_t$ is defined as the greatest integer less than or equal to $f_s t$ at each time t. Hence, $x[n]$ is a sequence of values whereas $x[n_t]$ is a continuous-time waveform.

A DEM DAC includes an all-digital DEM encoder and L 1-bit DACs. The 1-bit DAC outputs, $y_i(t)$, are summed to form the overall DAC output, $y(t)$, i.e., $$y(t) = \sum_{i=1}^{L} y_i(t) \tag{1}$$

The output of the ith 1-bit DAC has the form $$y_i(t) = x_i[n_t]K_i\Delta + e_i(t), \tag{2}$$

where $$x_i[n_t] = c_i[n_t] - \frac{1}{2}, \tag{3}$$

$c_i[n]$ is the 1-bit DAC input sequence, $K_i$ is a constant called the 1-bit DAC's weight, and $e_i(t)$ represents any deviation from ideal NRZ 1-bit DAC operation. For each n, $c_i[n]$ is either 0 or 1, so $x_i[n]$ is either $-\frac{1}{2}$ or $\frac{1}{2}$. By design, each $K_i$ is an integer, $K_1=1$, and $K_i \geq K_{i-1}$ for i=2, 3, . . . , L.

As shown in [6], each DEM encoder output bit sequence can be written as $$c_i[n] = \frac{1}{\Delta}(m_i x[n] + \lambda_i[n]) + \frac{1}{2} \tag{4}$$

for i=1, 2, . . . , L, where each $m_i$ is a constant and each $\lambda_i[n]$ is a sequence that respectively satisfy $$\sum_{i=1}^{L} K_i m_i = 1 \text{ and } \sum_{i=1}^{L} K_i \lambda_i[n] = 0. \tag{5}$$

An Example 14-Bit DEM DAC

To simplify the presentation, this disclosure presents the ISIC technique applied to the specific 14-bit DEM DAC shown in FIG. 1. The DEM DAC contains L=36 1-bit DACs with weights $$K_{2j-1} = K_{2j} = 2^{j-1} \text{ for } j \in \{1, 2, \ldots, 10\}, \text{and} \tag{6}$$

$$K_j = 1024 \text{ for } j \in \{21, \ldots, 36\}. \tag{7}$$

As shown in [6], the DAC's input sequence, x[n], can take on values in the range $\{-8192\Delta, -8191\Delta, \ldots, 8192\Delta\}$, and the ith DEM encoder output bit sequence can be written as (4) with $$m_i = \begin{cases} 0, & \text{if } i = 1, 2, \ldots 20, \\ 2^{-14}, & \text{if } i = 21, \ldots 36. \end{cases} \tag{7}$$

The DEM encoder includes a tree of 35 switching blocks, each of which is denoted as $S_{k,r}$ for k=1, . . . , 14 and r=1, . . . , 18. Switching blocks $S_{k,1}$ for k=5, . . . , 14 are called segmenting switching blocks, and the other switching blocks called are non-segmenting switching blocks. The input to the $S_{k,r}$ switching block is denoted as $c_{k,r}[n]$, and the input to the $S_{14,1}$ switching block is $c_{14,1}[n]=c[n]$, where $$c[n] = \frac{x[n]}{\Delta} + 9215. \tag{8}$$

Each switching block calculates its two output sequences as a function of its input sequence and one of 35 pseudo-random 1-bit sequences, $b_{k,r}[n]$, for k=1, 2, . . . , 14 and r=1, . . . , 18, which are designed to well-approximate white random sequences that are independent from each other and x[n], and each take on values of 0 and 1 with equal probability. The top and bottom outputs of the segmenting switching blocks, $S_{k,1}$, are $$\frac{1}{2}(c_{k,1}[n] - 1 - s_{k,1}[n]), \text{ and } 1 + s_{k,1}[n], \tag{9}$$

respectively, where $$s_{k,1}[n] = \begin{cases} 0, & \text{if } c_{k,1}[n] = \text{odd}, \\ 1, & \text{if } c_{k,1}[n] = \text{even}, b_{k,1}[n] = 1, \\ -1 & \text{if } c_{k,1}[n] = \text{even}, b_{k,1}[n] = 0. \end{cases} \tag{10}$$

Similarly, the top and bottom outputs of the non-segmenting switching blocks $S_{k,r}$ are $$\frac{1}{2}(c_{k,r}[n] - s_{k,r}[n]), \text{ and } \frac{1}{2}(c_{k,r}[n] + s_{k,r}[n]), \tag{11}$$

respectively, where $$s_{k,r}[n] = \begin{cases} 0, & \text{if } c_{k,r}[n] = \text{even}, \\ 1, & \text{if } c_{k,r}[n] = \text{odd}, b_{k,r}[n] = 1, \\ -1 & \text{if } c_{k,r}[n] = \text{odd}, b_{k,r}[n] = 0. \end{cases} \tag{12}$$

The $s_{k,r}[n]$ sequences are called switching sequences.

Inter-Symbol Interference

As explained in [1] and demonstrated experimentally in [2], $e_i(t)$ in (2) is well-modelled as $$e_i(t) = \begin{cases} e_{11i}(t), & \text{if } c_i[n_t - 1] = 1, c_i[n_t] = 1, \\ e_{01i}(t), & \text{if } c_i[n_t - 1] = 0, c_i[n_t] = 1, \\ e_{00i}(t), & \text{if } c_i[n_t - 1] = 0, c_i[n_t] = 0, \\ e_{10i}(t), & \text{if } c_i[n_t - 1] = 1, c_i[n_t] = 0, \end{cases} \tag{13}$$

where $e_{11i}(t)$, $e_{01i}(t)$, $e_{00i}(t)$, and $e_{10i}(t)$, are periodic waveforms with period $T_s=1/f_s$ that represent the error over each clock period corresponding to the four different possible current and previous 1-bit DAC input bit values. During any given $T_s$ clock period, the 1-bit DAC error, $e_i(t)$, is equal to exactly one of the $e_{11i}(t)$, $e_{01i}(t)$, $e_{00i}(t)$, and $e_{10i}(t)$ waveforms. The dependence of $e_i(t)$ on both the current and prior 1-bit DAC input bit values results in ISI.

As proven in [1], the DAC output can be written as $$y(t) = \alpha(t)x[n_t] + \beta(t) + e_{DAC}(t), \tag{14}$$

where $\alpha(t)$ and $\beta(t)$ are $T_s$-periodic waveforms that only depend on the $e_i(t)$ waveforms, and $e_{DAC}(t)$ is an $x[n]$-dependent waveform resulting from component and timing mismatches and ISI. The $\alpha(t)x[n_t]$ term is the desired signal component of the DAC's output waveform; its continuous-time Fourier transform is the product of the discrete-time Fourier transform of $x[n]$ and the continuous-time Fourier transform of one period of $\alpha(t)$, so $\alpha(t)x[n_t]$ is a linear, continuous-time representation of $x[n]$. Given that $\beta(t)$ is $T_s$-periodic and independent of $x[n]$, it does not represent nonlinear distortion, so it is not problematic in typical applications. In contrast, $e_{DAC}(t)$ depends on $x[n]$ and is not periodic in general, so it is problematic in typical applications.

As also proven in [1], the $e_{DAC}(t)$ term in (14) can be written as $$e_{DAC}(t) = e_{MM}(t) + e_{ISI-linear}(t) + e_{ISI-nonlinear}(t) + e_{ISI-noise}(t), \qquad (15)$$

where $e_{MM}(t)$ is error that arises from component and timing mismatches, but not ISI, and the three other terms are different types of error that arise from ISI. The details of the four error components in (15) are presented below. Applying the results in [6] for the DEM DAC of FIG. 1 to the general $e_{MM}(t)$ expression derived in [1] results in $$e_{MM}(t) = \sum_{i=1}^{35} d_i(t)s_i[n_t], \qquad (16)$$

where each $d_i(t)$ is a $T_s$-periodic waveform that depends only on the $e_{11i}(t)$, $e_{01i}(t)$, $e_{00i}(t)$, and $e_{10i}(t)$ waveforms, and each $s_i[n]$ is one of the switching sequences given by (10) and (12) but renamed to have a single subscript index for convenience, e.g., $s_1[n]=s_{14,1}[n]$, $s_2[n]=s_{13,1}[n]$, etc. Hence, it follows from the statistical properties of the switching sequences that $e_{MM}(t)$ is a noise-like waveform that is zero-mean and uncorrelated with the DAC input.

The $e_{ISI-linear}(t)$ expression is $$e_{ISI-linear}(t) = \underbrace{\left(\frac{1}{\Delta}\sum_{i=21}^{36} m_i\gamma_i(t)\right)}_{\square\gamma(t)}x[n_t - 1]. \qquad (17)$$

where $$\gamma_i(t) = \frac{1}{2}[e_{11i}(t) - e_{00i}(t) - e_{01i}(t) + e_{10i}(t)]. \qquad (18)$$

As $\gamma(t)$ is a linear combination of the $\gamma_i(t)$ waveforms, it too is $T_s$-periodic. It follows that $e_{ISI-linear}(t)$ has the same general form as the DEM DAC's desired signal except for a one period delay and a factor of $\gamma(t)$ instead of $\alpha(t)$. Thus, although it is an error component, it represents linear error. The $e_{ISI-nonlinear}(t)$ expression is $$e_{ISI-nonlinear}(t) = \underbrace{\left(\frac{1}{\Delta^2}\sum_{i=21}^{36} m_i{}^2\eta_i(t)\right)}_{\square\eta(t)}x[n_t]x[n_t - 1], \qquad (19)$$

where $$\eta_i(t) = e_{11i}(t) + e_{00i}(t) - e_{01i}(t) - e_{10i}(t). \qquad (20)$$

As $\eta(t)$ is a linear combination of the $\eta_i(t)$ waveforms, it too is $T_s$-periodic. It follows that $e_{ISI-nonlinear}(t)$ is equivalent to the result of applying an LTI filter to an ideal continuous-time version of $x[n]x[n-1]$. Consequently, $e_{ISI-nonlinear}(t)$ is pure second-order distortion that is not mitigated by DEM. It is present regardless of whether DEM is used.

The $e_{ISI-noise}(t)$ expression is $$e_{ISI-noise}(t) = \frac{1}{\Delta^2}\sum_{i=1}^{36} \lambda_i[n_t]\lambda_i[n_t - 1]\eta_i(t) \qquad (21)$$

$$+ \frac{1}{\Delta^2}\sum_{i=21}^{36} m_i(x[n_t]\lambda_i[n_t - 1] + x[n_t - 1]\lambda_i[n_t])\eta_i(t).$$

$$+ \frac{1}{\Delta}\sum_{i=1}^{36} \lambda_i[n_t - 1]\gamma_i(t)$$

Each term in (21) is proportional to either $\lambda_i[n_t]$, $\lambda_i[n_t-1]$, or $\lambda_i[n_t]\lambda_i[n_t-1]$, and, as shown in [6], $$\left.\begin{array}{r}E\{\lambda_i[n]\} = 0 \\ E\{\lambda_i[n]\lambda_i[m]\} = 0 \text{ for } m \neq n\end{array}\right\} \text{ regardless of } x[n], \qquad (22)$$

where $E\{u\}$ denotes the expected value of $u$, so $e_{ISI-noise}(t)$ is a noise-like waveform that is zero-mean and uncorrelated with $x[n]$, similar to $e_{MM}(t)$. Consequently, the $e_{ISI-noise}(t)$ term increases the noise power of the DEM DAC output relative to cases in which ISI is avoided, but it does not introduce harmonic distortion.

Subsampling ISIC Technique

This section presents a subsampling version of the proposed ISIC technique. It is applied to a DEM DAC of the type shown in FIG. 1 along with the subsampling version of the MNC technique presented in [3].

The ISIC Problem Statement

An objective of the ISIC technique is to adaptively measure and cancel $e_{ISI-nonlinear}(t)$ and the first two summations in the expression for $e_{ISI-noise}(t)$ given by (21) over the DAC's first Nyquist band. It may not be necessary to cancel last summation in (21) as it is already cancelled by the MNC technique [4].

As (7) indicates, $m_i=0$ for $i=1, 2, \ldots, 20$, so the summation on the right side of (19) and the middle summation on the right side of (21) can both be extended to include the $i=1, 2, \ldots, 20$ terms without changing the values of the equations. Hence, it follows from combining (3), (4), (19), and (21) that the portion of $e_{ISI-nonlinear}(t)+e_{ISI-noise}(t)$ which the ISIC technique is intended to cancel over the DAC's first Nyquist band can be written as $$e_{ISI}(t) = \frac{1}{4}\sum_{i=1}^{36} p_i[n_t]\eta_i(t), \qquad (23)$$

where $$p_i[n] = 4x_i[n]x_i[n - 1]. \qquad (24)$$

Given that $x_i[n]$ is restricted to values of $-\frac{1}{2}$ and $\frac{1}{2}$, $p_i[n]$ is restricted to values of $-1$ and $1$ by definition.

In contrast, the MNC technique adaptively measures and cancels each term in (16) over the DAC's first Nyquist band. Equations (16) and (23) are similar: both $\eta_i(t)$ and $d_i(t)$ are unknown, $T_s$-periodic waveforms, and both $p_i[n]$ and $s_i[n]$ are known digital sequences whose nonzero values are restricted to 1 and $-1$. At first glance, this suggests that the ISIC technique could be implemented in the same fashion as the MNC technique. Unfortunately, doing so would not work because the MNC technique relies on the $s_i[n]$ sequences being uncorrelated with each other and the main DAC's input sequence, but the $p_i[n]$ sequences are neither uncorrelated with each other nor uncorrelated with the main DAC's input sequence. As described below, this dictates significant differences between the implementations of the two techniques, despite some similarities.

Example Combined ISIC and MNC Technique Implementation

Figures 2, 3:
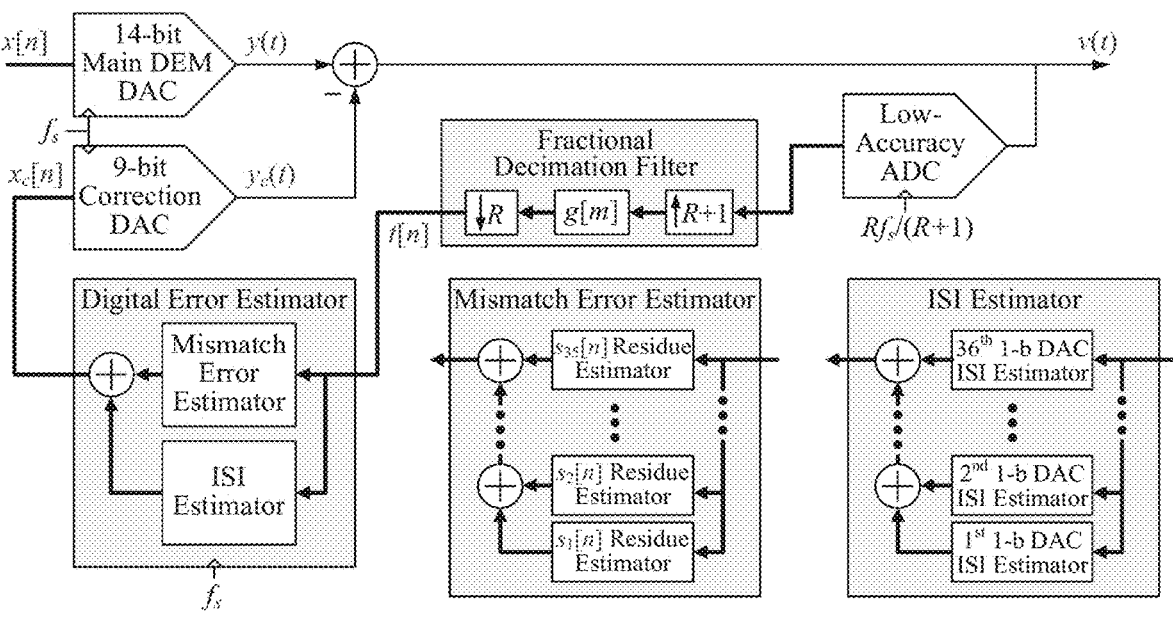
FIG. 2 shows a high-level view of an ISI cancellation (ISIC) technique applied to a 14-bit main DAC of the type shown in FIG. 1 along with an MNC technique.
FIG. 3 shows an illustration of each $s_i[n]$ residue estimator, which can be part of the mismatch error estimator, including an N-tap adaptive filter that includes a coefficient calculator, a bank of coefficient subsampling flip-flops, and an FIR filter.

FIG. 2 shows a high-level view of the ISIC technique applied to a 14-bit main DAC of the type shown in FIG. 1 along with the MNC technique presented in [3]. The low-accuracy ADC, fractional decimation filter, mismatch error estimator, and 9-bit correction DAC are all as presented in [3], so they are only briefly described below for context.

The main DAC, correction DAC, and digital error estimator are all clocked at a rate of $f_s$ whereas the ADC is clocked at a rate of $Rf_s/(R+1)$, where R is a positive integer. For example, the simulation results presented herein use $f_s=3$ GHz and R=5, so the ADC sample rate is 2.5 GHz.

The purpose of each $s_i[n]$ residue estimator in the mismatch error estimator is to measure and cancel the ith term in (16) over the DAC's first Nyquist band. As shown in FIG. 3, each $s_i[n]$ residue estimator implements an N-tap adaptive filter comprised of a coefficient calculator, a bank of coefficient subsampling flip-flops, and an FIR filter. As mentioned above, each $s_i[n]$ sequence is one of the switching sequences generated within the DEM encoder. The coefficient calculator correlates its input with time shifted versions of the switching sequence to generate the adaptive FIR filter impulse response coefficients. The tradeoffs associated with the choice of integers N, P, and Q and the accumulator gain, K, are described in [3].

As shown in [3], to the extent that the discrete-time Fourier transform of the fractional decimation filter's g[m] coefficients accurately satisfies $$|G(e^{j\omega})| = \begin{cases} 1, & \text{if } |\omega| < \pi/R, \\ 0, & \text{if } \pi/R < |\omega| < \pi, \end{cases} \tag{25}$$

and the ADC effectively suppresses signal content at frequencies above $Rf_s/2$, the accuracy with which the MNC technique is capable of canceling $e_{MM}(t)$ over the DAC's first Nyquist band is limited only by the length, N, of the adaptive filters in the mismatch error estimator. Furthermore, for the reasons explained in [3]-[5], the MNC technique is largely insensitive to ADC noise and nonlinearity, which is why the MNC-enabled DAC IC presented in [5] achieves a peak first Nyquist-band signal-to-noise-and-distortion ratio (SNDR) of 77 dB despite the use of an uncalibrated 5-bit ring VCO based ADC with an SNDR of less than 26 dB. For the reasons presented in the next section, the ISIC technique also has these properties.

The system is not insensitive to nonlinearity and noise introduced by the correction DAC. However, the dynamic range of $e_{DAC}(t)$ is much smaller than that of the main DAC's input sequence, x[n], so the correction DAC's resolution and step-size are generally much smaller than those of the main DAC. Consequently error from the correction DAC's component mismatches, clock skew, and ISI is much smaller than that from the main DAC to the point that it can typically be neglected.

Figure 4A:
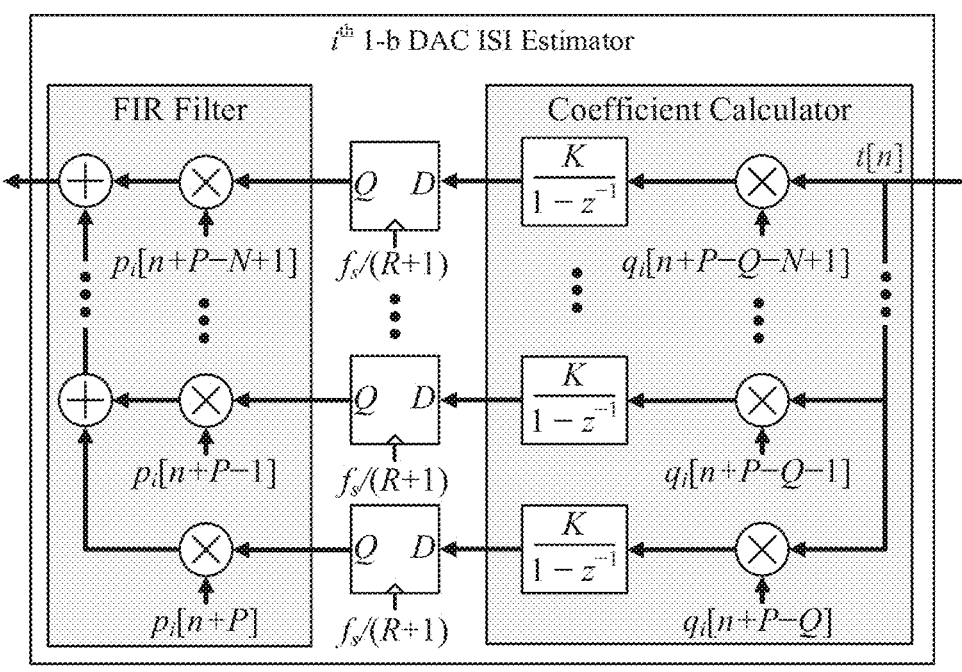
FIG. 4A shows a graphical representation of the ith 1-bit DAC ISI estimator designed to at least partially cancel the ith term of Equation (23) over the DAC's first Nyquist band.

The ith 1-bit DAC ISI estimator is shown in FIG. 4a. Its objective is to cancel the ith term of (23) over the DAC's first Nyquist band. Its FIR filter operates on a P-sample advanced version of (24), i.e., $p_i[n+P]$, and has an impulse response corresponding to the subsampled outputs of the coefficient calculator. Instead of correlating against the $p_i[n]$ sequences, which would be analogous to what is done by the MNC technique but would not work for the reason explained above, the coefficient calculator correlates against time-shifted versions of a sequence $q_i[n]$ that depends on subsets of the DEM encoder's switching sequences. Specifically, $$q_{2j-u}[n] = v_j[n] - (-1)^u w_j[n] \tag{26}$$

For each $i = 2j - u$, where $j \in \{1, 2, \ldots, 18\}$, $u \in \{0, 1\}$ $$v_j[n] = \begin{cases} s'_j[n], & \text{if } u_j[n] \le 0, \\ 0 & \text{otherwise,} \end{cases} \tag{27}$$

$$w_j[n] = \begin{cases} s''_j[n], & \text{if } s'_j[n] = 0, u_j[n] \ge 0, \\ 0 & \text{otherwise,} \end{cases} \tag{28}$$

$$s'_j[n] = s_{1,j}[n]s_{1,j}[n-1], \tag{29}$$

$$s''_j[n] = \begin{cases} \begin{aligned} &s_{15-j,1}[n]s_{1,j}[n-1] + \\ &s_{1,j}[n]s_{15-j,1}[n-1], \end{aligned} & \text{if } j = 1, 2, \ldots 10, \\ \begin{aligned} &(-1)^{j-1}\left(s_{1,j}[n]s_{2,\lfloor \frac{j-9}{2} \rfloor}[n-1] + \right. \\ &\left. s_{2,\lfloor \frac{j-9}{2} \rfloor}[n]s_{1,j}[n-1]\right), \end{aligned} & \text{if } j = 11, 12, \ldots 18, \end{cases} \tag{30}$$

and $$u_j[n] = \sum_{m=0}^{n-1} |v_j[m]| - |w_j[m]|. \tag{31}$$

Figure 4B:
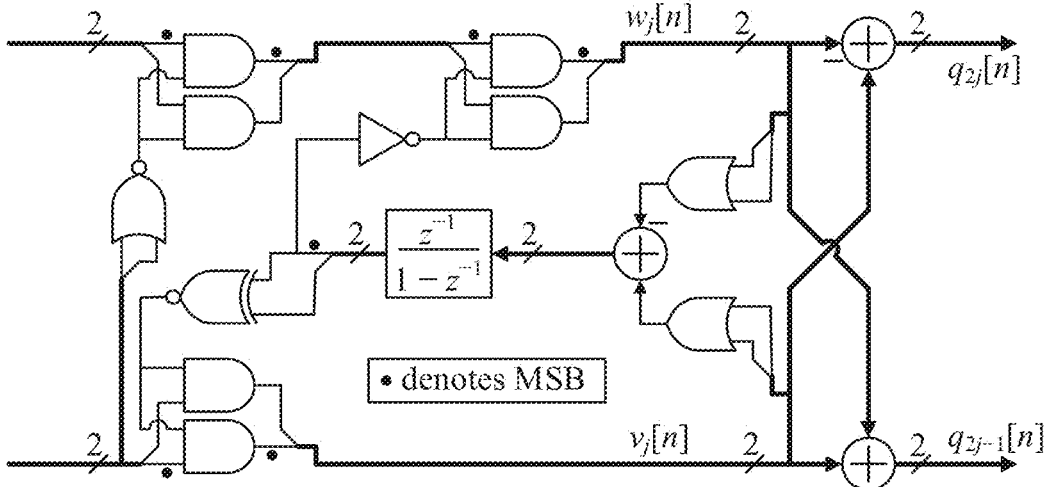
FIG. 4B shows digital logic that can be employed for generating the sequence $q_i[n]$ for each pair of values $i=2j-1$ and $i=2j$.

As proven in the next section, $q_i[n]$ is restricted to values of $-1$, 0, and 1 and has the necessary statistical properties for the ISIC technique to work alongside the MNC technique with comparable tradeoffs and robustness properties to those of the MNC technique. FIG. 4b shows digital logic that can be used to generate $q_i[n]$ for each pair of values i=2j$-$1 and i=2j.

During foreground calibration mode, the combined MNC and ISIC techniques are run simultaneously with the main DAC's input set to $x[n]=x_{FG}+r[n]$, where $x_{FG}$ is a constant and r[n] toggles pseudo-randomly between 0 and $\Delta$. The constant, $x_{FG}$, is chosen to ensure that all of the DEM encoder's switching sequences have a relatively high density of nonzero values (the higher the density of nonzero values, the higher the adaptive filter convergence rate). Many choices of $x_{FG}$ achieve this objective. For example, the foreground simulations presented herein use $x_{FG}=23894$.

Once the adaptive filter coefficients have converged, the system exits foreground calibration mode and enters mission mode, wherein the main DAC's input sequence can be any sequence with values in the set $\{-8192\Delta, -8191\Delta, \ldots, 8192\Delta\}$. If background calibration is not implemented, the MNC and ISIC FIR filters remain enabled but the coefficient calculators are frozen at their converged values. If background calibration is implemented, the FIR filters and coefficient calculators remain enabled during mission mode.

The purpose of background calibration, if implemented, is to track and correct for temperature-dependent circuit parameter changes during mission mode that affect $e_{MM}(t)$ and $e_{ISI}(t)$. The analyses of the MNC and ISIC techniques presented in the next section and in [3] assume that the statistics of the DEM encoder's switching sequences, which depend somewhat on x[n], are time-invariant. This is ensured during foreground calibration mode by the choice of x[n], but is not ensured during mission mode when x[n] is arbitrary. A way to circumvent this issue, if necessary, is to slightly modify the MNC and ISIC coefficient calculators during mission mode to sometimes not clock the subsampling flip-flops and accumulators as described in [3].

The benefit of foreground calibration is that it can be configured for faster adaptive filter coefficient convergence than background calibration. During foreground calibration, the time-varying component of x[n] has an amplitude equal to the minimum step-size of the main DAC. Consequently, the convergence bandwidths of the feedback loops in both the MNC and ISIC techniques, which are set by the choice of the accumulator gain, K, can be relatively high without significantly degrading coefficient convergence accuracy.

In contrast, x[n] is arbitrary during mission mode, so if background calibration is implemented, K must be reduced relative to its foreground calibration value to prevent large and rapid temporal variations in x[n] from degrading the coefficient accuracy. However, as background calibration is only necessary to track temperature-dependent circuit parameter changes, its reduction in convergence rate relative to foreground calibration is unlikely to be an issue in practice except in unusual applications where large temperature changes are expected to occur over time periods on the order of a few seconds. Furthermore, simulations suggest that $e_{MM}(t)$ and $e_{ISI}(t)$ are only weakly dependent on temperature for the CMOS DAC circuits designed by the authors, and the measured IC performance presented in [5] was found not to degrade over observation periods of many hours in the absence of background calibration. These observations suggest that background calibration is likely not necessary in many applications.

Simulation Results

The MNC and ISIC techniques require tens to hundreds of millions of clock cycles to converge, and the DACs and ADC have a large number of analog nodes, so impractically long simulation times—on the order of months—would be required to simulate the full system with transistor-level analog circuitry. Instead, realistic behavioral simulations of the full system have been performed to demonstrate that the MNC and ISIC techniques perform as predicted by theory, and separate transistor-level simulations of the main DAC have been performed to demonstrate that the primary assumption on which the MNC and ISIC techniques are based is consistent with practical circuit implementations.

TABLE 1

| Design parameters | | |
| --- | --- | --- |
| | Description | Value |
| Clocks | Main clock rate, $f_s$ | 3 GHz |
| | Subsampling clock rate, $Rf_s/(R + 1)$ | 2.5 GHz |
| DACs | 14-bit Main DAC LSB current | 1.2 μA |
| | 9-bit Correction DAC LSB current | 0.3 μA |
| | Differential load resistance | 25 Ω |
| Low-Accuracy | Number of ring VCO delay elements | 15 |
| VCO-Based | VCO center frequency | 2.5 GHz |
| ADC | VCO gain | 2.5 GHz/V |
| Digital | Down-sample factor, R | 5 |
| Fractional | Up-sample factor, R + 1 | 6 |
| Decimation | Length of g[n] | 41 |

TABLE 1-continued

| Design parameters | | |
| --- | --- | --- |
| | Description | Value |
| Filter | Precision of g[n] multipliers | 10 bits |
| Digital Error | Adaptive filter length, N | 16 |
| Estimafor | ISIC/MNC feedback loop group delay, Q | 12 |
| | ISIC/MNC adaptive filter input advance, P | 8 |
| | ISIC accumulator gain, K | $2^{-10}$ |
| | MNC accumulator gain, K | $2^{-11}$ |

TABLE 2

| Nonideal circuit behavior details | | |
| --- | --- | --- |
| | Description | Value |
| Clocks | Main clock RMS jitter | 20 fs |
| | Subsampling clock RMS jitter | 300 fs |
| Main | 1-bit DAC nominal rising edge time constant | 25 ps |
| DAC | 1-bit DAC rising edge time constant mismatch | 2.5% |
| | 1-bit DAC nominal falling edge time constant | 25 ps |
| | 1-bit DAC falling edge time constant mismatch | 2.5% |
| | LSB 1-bit DAC current mismatch | 2.5% |
| | 1-bit DAC average clock delay | 10 ps |
| | 1-bit DAC clock skew standard deviation | 1 ps |
| Correction | 1-bit DAC nominal rising edge time constant | 25 ps |
| DAC | 1-bit DAC rising edge time constant mismatch | 4% |
| | 1-bit DAC nominal falling edge time constant | 25 ps |
| | 1-bit DAC falling edge time constant mismatch | 4% |
| | LSB 1-bit DAC current mismatch | 3.2% |
| | 1-bit DAC average clock delay | 50 ps |
| | 1-bit DAC clock skew standard deviation | 1.8 ps |

Behavioral Simulations

The behavioral simulations model the system of FIG. 2 with NRZ current-steering main and correction DACs, and a low resolution VCO-based ADC. Table I summarizes the simulated system's design parameters and Table II summarizes the simulated system's nonideal circuit behavior.

Both the 14-bit main DAC and the 9-bit correction DAC incorporate current-steering NRZ 1-bit DACs. The main DAC is the DEM DAC described in Section II-B. The correction DAC includes 9 power-of-two-weighted 1-bit DACs without DEM. Dithered quantization is used to ensure that the inputs to the two DACs are 14-bit and 9-bit sequences.

The VCO-based ADC includes a voltage-to-current converter followed by a 15-element pseudo-differential current starved ring oscillator as in [5], so it behaves like a first-order delta-sigma modulator with a 30-level quantizer. Its 30-level digital output sequence is represented as an integer-valued two's complement code.

As explained and demonstrated in [5], such ring oscillator VCO based ADCs are particularly attractive in this application because they are extremely efficient in terms of area and power consumption when used without calibration, and the application's insensitivity to nonlinearity makes ADC calibration unnecessary. The first-order quantization noise shaping performed by the ADC is incidental in that it neither significantly helps nor hurts the system's overall performance because the ADC subsamples its input signal. Consequently, a Nyquistrate ADC such as a flash or SAR ADC could have been used instead. Any delay introduced by the ADC would simply affect the choices of Q and P as explained in [3].

The fractional decimation filter is implemented as a polyphase structure such that all its operations occur at a rate of $f_s=3$ GHz or lower. Its 41 g[n] coefficients were generated via the Parks-McClellan algorithm and quantized to 10-bit precision in Matlab such that the discrete-time Fourier Transform of g[n] approximates (25) with a passband ripple of 1.74 dB, a stopband attenuation of −40 dB, and a frequency transition bandwidth of $(0.0312)\pi$ centered at $\pi/5$.

The selection of design parameters N, K, P, and Q and their tradeoffs are explained in [3]-[5]. The information in these prior publications was originally intended to apply only to the MNC technique, but as shown in Section IV, the ISIC technique inherits many properties of the MNC technique, among which are the selection process and tradeoffs associated with the N, K, P, and Q design parameters, so the information applies to the ISIC technique too.

The behavioral simulations could have been performed via a commercially-available simulation platform, such as Matlab or a System Verilog simulator, but, to maximize simulation speed, the behavioral simulations presented below were instead performed by a custom, C-language, event-driven simulator. The simulator has three types of events: the rising edges of the 3 GHz clock, the rising edges of the 2.5 GHz clock, and the sample times of the output waveform. The latter is set to 3 THz so the resulting output spectra well-model those of continuous-time waveforms. Jitter, modeled as white noise, is applied to the two clock signals, so the clock edges are not aligned to any specific time grid. Consequently, it is necessary for the simulator to have a parametric model of the main and correction DAC outputs. This is achieved by modeling the rising and falling transitions of each 1-bit DAC as scaled step responses of first-order continuous-time filters. The time constants of these transitions are randomly mismatched to introduce ISI.

The simulated nonideal circuit behavior details (Table II) are consistent with practical transistor-level circuits developed by the authors. The only exception is that the 3 GHz main clock's RMS jitter is set to 20 fs. This level of clock jitter is lower than would be needed in practice, but was nevertheless chosen for the simulation to prevent output error caused by clock jitter from masking the cancellation performance of the MNC and ISIC techniques. All high-speed, high-resolution continuous-time DACs are sensitive to clock jitter, so a higher main clock jitter would have increased the DAC's output noise floor to the point that it would have masked more of the cancellation performance of the MNC and ISIC techniques. Interestingly, simulations suggest that the MNC and ISIC techniques are not sensitive to jitter on the 2.5 GHz subsampling clock. Consequently, its RMS jitter was set to 300 fs, which is not a challenging specification.

For this implementation, the two's-complement word widths of the ADC output, the fractional decimation filter output, the MNC coefficient calculator accumulators, and the ISIC coefficient calculator accumulators are 5, 14, 25, and 26 bits, respectively. Although these values are not prohibitively large in the context of the proposed system by the standards of modern CMOS technology, they can be reduced if necessary via dithered quantization. Specifically, dithered quantization can be applied to significantly reduce the word-width of the fractional decimation filter output, which would correspondingly reduce the subsequent word widths. The quantization error would be white and uncorrelated with all other variables in the system, and the component of the fractional decimation filter output sequence that each coefficient calculator in the digital error estimator correlates against occupies a very small portion of the fractional decimation filter's output dynamic range, so the additional quantization noise would only slightly increase the mean square error (MSE) of the MNC and ISIC coefficients. If necessary, this MSE increase can be avoided by slightly decreasing the gain, K, of the ISIC and MNC accumulators at the expense of a small increase in convergence time.

Figure 5:
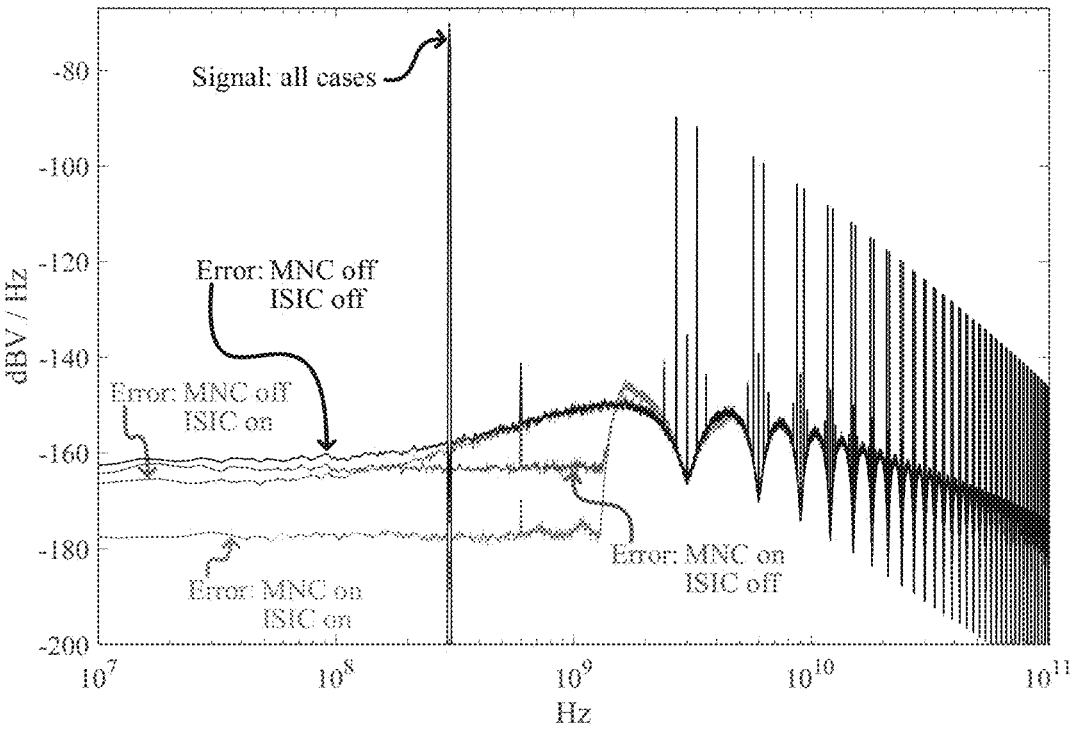
FIG. 5 shows the simulated output spectra of the system with a full-scale sinusoidal input under various calibration conditions, illustrating performance improvements measured in SNDR for combinations of ISIC and MNC techniques enabled or disabled.

FIG. 5 shows the simulated output spectra of the system with a full-scale sinusoidal input for four cases: ISIC and MNC both enabled, ISIC disabled and MNC enabled, ISIC enabled and MNC disabled, and ISIC and MNC both disabled. In each case the sinusoidal minimum error method was used to separate the desired signal component from the error component. All the resulting power spectra are superimposed for ease of comparison. Relative to the case of no calibration, the ISIC and MNC techniques together result in an average performance improvement of over 23 dB, whereas the MNC technique alone results in an average performance improvement of only 8 dB, and the ISIC technique alone offers an average performance improvement of less than a dB.

The nonzero frequency transition bandwidth of the fractional decimation filter's g[n] coefficients' discrete-time Fourier transform degrades the MNC and ISIC error cancellation accuracy between 1.3 GHz and 1.5 GHz. This degradation could have been reduced at the expense of additional fractional decimation filter complexity, i.e., by using more g[n] coefficients in the fractional decimation filter to reduce the frequency transition bandwidth. Alternatively, a slightly higher main clock-rate could have been used to achieve good cancellation up to 1.5 GHZ, which would likely be a better tradeoff than increasing the fractional decimation filter's complexity. Over the 0 to 1.3 GHz frequency band, the simulation results shown in FIG. 5 correspond to SNDR's of 80.5 dB, 66.7 dB, 58.6 dB and 58.0 dB for the cases of ISIC and MNC both enabled, ISIC disabled and MNC enabled, ISIC enabled and MNC disabled, and ISIC and MNC both disabled, respectively. The power spectrum corresponding to ISIC and MNC both disabled has been plotted on top of the other power spectra in FIG. 5 to make visible the small amount of additional error caused by the ISIC and MNC techniques above the first Nyquist band.

Figure 6A:
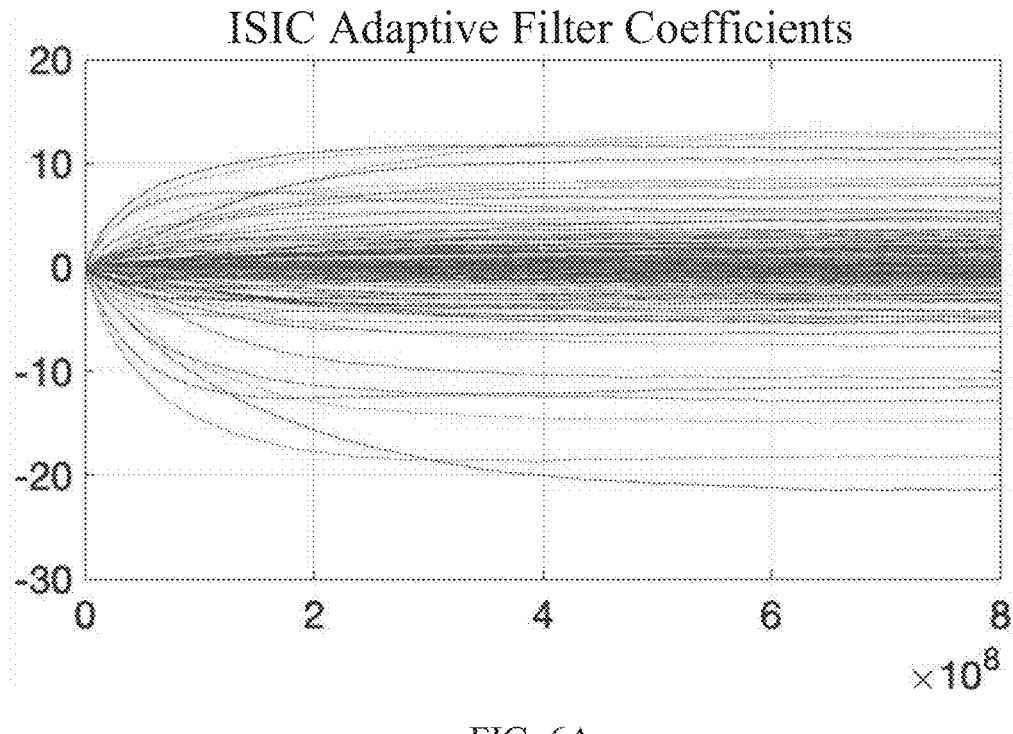
FIGS. 6A and 6B show simulated convergence trajectories of the ISIC and MNC adaptive filter coefficients, respectively, during foreground calibration over a span of 800 million 3 GHz clock periods, demonstrating consistency with theoretical results.
Figure 6B:
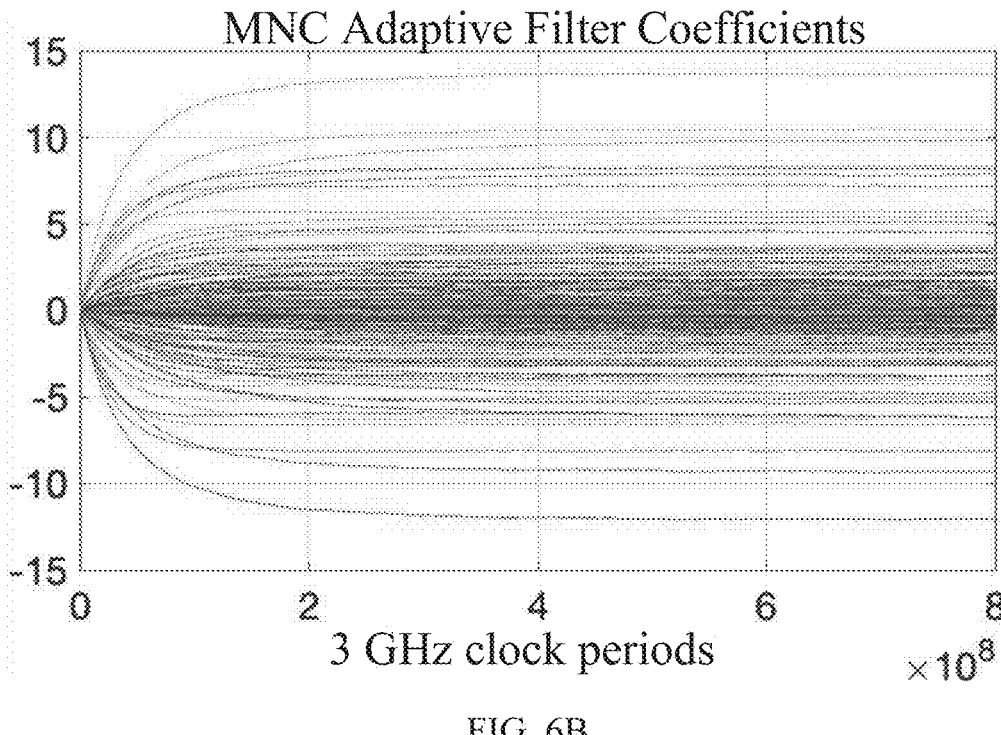

FIG. 6 shows the corresponding simulated convergence trajectories of the MNC and ISIC adaptive filter coefficients during foreground calibration over 800 million 3 GHz clock periods. The simulated convergence behavior is consistent with the theoretical results presented in [3]. Those results apply directly to the MNC technique, and, as a result of the analysis presented in Section IV, they also apply to the ISIC technique.

Transistor-Level Simulations

The primary assumption on which the MNC and ISIC techniques are based is that the 1-bit DAC output waveforms can be written as (2) with error that is well-modeled as (13), where $e_{11i}(t)$, $e_{01i}(t)$, $e_{00i}(t)$, and $e_{10i}(t)$, are $T_s$-periodic waveforms. To the extent that this assumption is valid, the $e_{11i}(t)$, $e_{01i}(t)$, $e_{00i}(t)$, and $e_{10i}(t)$ waveforms, if known, can be used to calculate an accurate estimate of $e_{DAC}(t)$. Specifically, for the DEM DAC of FIG. 1 and any input sequence, x[n], the $e_{11i}(t)$, $e_{01i}(t)$, $e_{00i}(t)$, and $e_{10i}(t)$ waveforms can be used with the DEM encoder output bit sequences to calculate the $e_i(t)$ waveforms via (13), which can be used with (1), (2) and (3) to calculate the DEM DAC's output waveform, $\gamma(t)$. Then, $e_{DAC}(t)$ can be calculated via (14) as $$e_{DAC}(t) = y(t) - \alpha(t)x[n_t] - \beta(t), \qquad (32)$$

where, as shown in [1], $\alpha(t)$ and $\beta(t)$ are given by $$\alpha(t) = 1 + \frac{1}{2\Delta}\sum_{i=1}^{N}m_i[e_{11i}(t) - e_{00i}(t) + e_{01i}(t) - e_{10i}(t)] \text{ and} \quad (33)$$

$$\beta(t) = \frac{1}{4}\sum_{i=1}^{N}[e_{11i}(t) + e_{00i}(t) + e_{01i}(t) + e_{10i}(t)]. \quad (34)$$

The theoretical analysis presented in the next section proves, and the behavioral simulations presented above demonstrate, that the MNC and ISIC techniques work provided the above-mentioned assumption holds, but they do not speak to whether practical circuits satisfy the assumption. However, the techniques implemented in the integrated circuits presented in [2] and [5] rely on the assumption and achieve state-of-the-art performance, which suggests that the assumption is valid in practical circuits.

The following transistor-level simulation results further support this assertion. The DEM DAC of FIG. 2 with the parameters listed in Table I and realistically mismatched transistor-level 1-bit DACs was simulated in the Global Foundries 22 nm FDSOI process to extract the $e_{11i}(t)$, $e_{01i}(t)$, $e_{00i}(t)$, and $e_{10i}(t)$ waveforms. Then the DEM DAC was simulated again with a sinusoidal input sequence and the $e_{DAC}(t)$ waveform, calculated as described above, was subtracted from the DEM DAC's simulated output waveform.

Figures 7, 8:
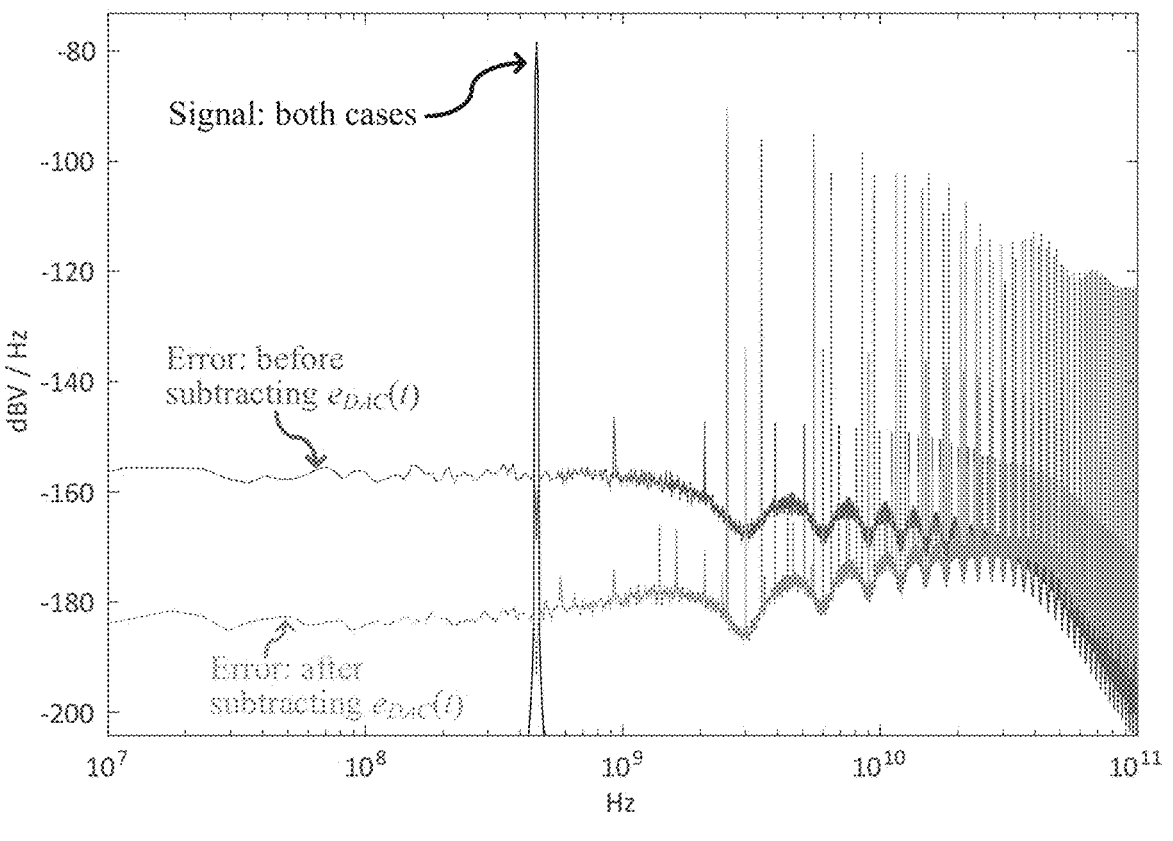
FIG. 7 shows the DEM DAC's simulated output power spectrum before and after the subtraction of $e_{DAC}(t)$, demonstrating that the simulated circuit validates the initial assumptions upon which the underlying analysis is based.
FIG. 8 shows the schematic of the simulated 1-bit DAC circuit, which includes a switch driver and current-steering cell, shown without any behavioral components and complemented by transistor-level bias voltage generation circuitry not shown in the figure.

FIG. 7 shows the DEM DAC's simulated output power spectrum before and after subtraction of $e_{DAC}(t)$. The corresponding first Nyquist band SNDR values are 56 dB and 78 dB before and after subtraction of $e_{DAC}(t)$, respectively, which suggests that the assumption is valid for the simulated circuit. As $e_{DAC}(t)$ was calculated and directly subtracted from the DEM DAC's output waveform, the error cancellation occurred over all Nyquist bands. In contrast, the MNC and ISIC techniques generate a discrete time estimate of $e_{DAC}(t)$, so the corresponding error cancellation is restricted to a single Nyquist band. As shown in [1], the ISI from a DEM DAC can be written as the sum of a linear component, a nonlinear component, and a noise-like component. The linear component in this case causes a roll-off of the replicas of the signal in higher Nyquist bands, so when the ISI is subtracted from the output of the DEM DAC, a side-effect is that it reduces this roll-off as can be seen in FIG. 7. Therefore, the phenomenon is neither unexpected nor problematic.

The simulated 1-bit DAC circuit schematic is shown in FIG. 8. It includes a switch driver and current-steering cell, all of which was implemented without any behavioral components. Although not shown in FIG. 8, transistor-level bias voltage generation circuitry and passive components to model the bond wired supply voltages assuming a QFN package were also implemented. The flip-flops are powered by a 0.8 V digital supply, whereas the latches are powered by a separate 0.8 V analog supply. The bias voltage generation circuitry for the current-steering cell is powered by a 1.2 V supply.

As is common-practice in high-performance current steering DAC implementations, the switch driver was designed such that its switching activity is signal-independent to minimize nonlinearity. This is achieved via a dummy path driven by $c_{i,d}[n]$ and its complement, where $c_{i,d}[n]$ has a level transition during any given clock interval if and only if the input sequence to the main path, $c_i[n]$, does not have a level transition during the clock interval. The latch circuits are as presented to ensure that the current switching transistors, $M_3$ and $M_4$, are never simultaneously turned off.

To maximize the 1-bit DAC's output impedance, the current steering cell's bias voltages are such that the switching transistors, $M_3$ and $M_4$, are either off or in saturation at any given time, and all the other transistors are always in saturation. Transistors $M_9$ through $M_{12}$ implement small current sources to prevent cascode transistors $M_5$ and $M_6$ from ever fully turning off so as to reduce code-dependent output impedance variations. The transistor sizing strategy for each current steering cell and the scaling strategy for the differently weighted 1-bit DACs are as described in [2].

For each i=1, 2, . . . , 36, the $e_{11i}(t)$, $e_{01i}(t)$, $e_{00i}(t)$, and $e_{10i}(t)$ waveforms were extracted by simulating the bank of 1-bit DACs, package models, bias circuitry, and output load with the inputs to all but the ith 1-bit DAC held constant, and the ith 1-bit DAC input set to the two-period sequences 11, 01, 00, and 10, respectively. Then, simulations were performed with the same circuitry along with the DEM encoder. The DEM encoder input sequence and output bits along with the extracted $e_{11i}(t)$, $e_{01i}(t)$, $e_{00i}(t)$, and $e_{10i}(t)$ waveforms were used to calculate $e_{DAC}(t)$ as described above.

Subsampling ISIC Technique Analysis

Figure 9:
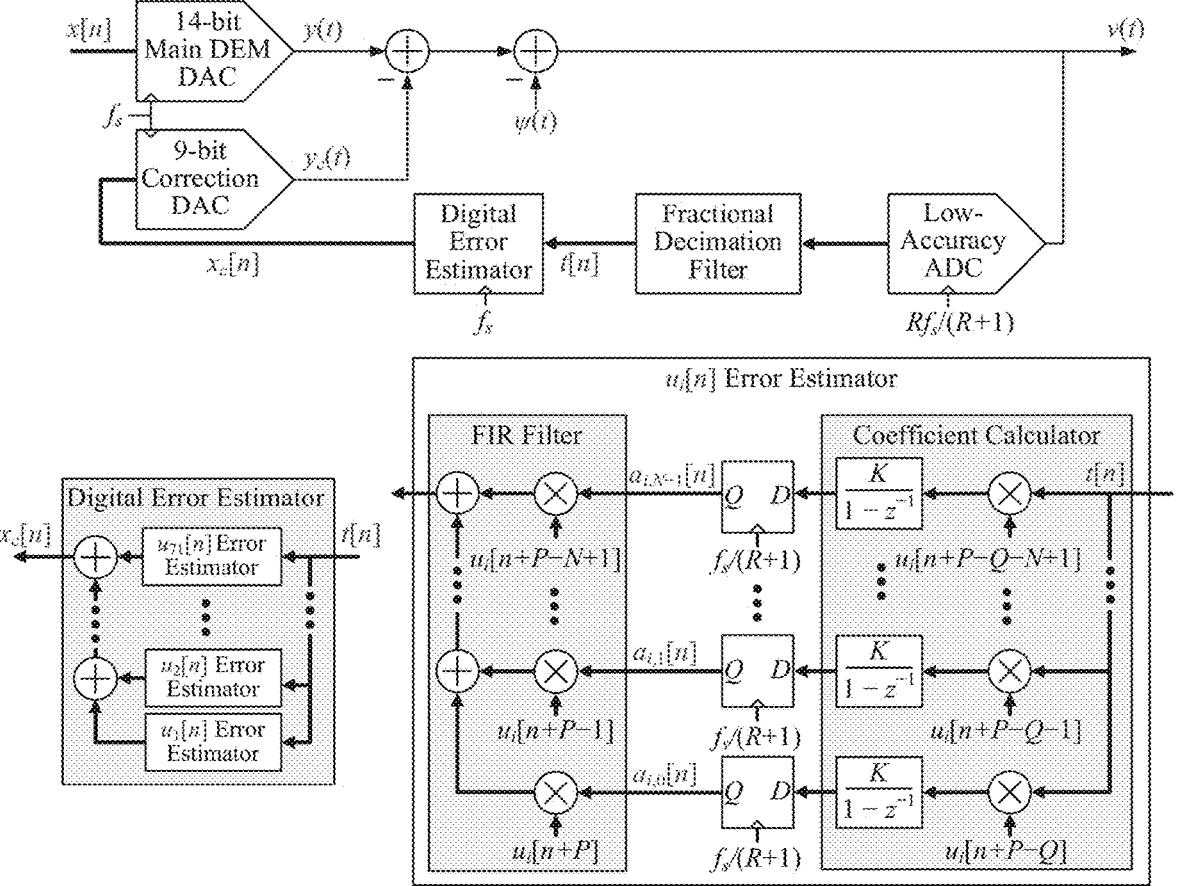
FIG. 9 shows a modified version of the system which may serve as an intermediate step for the analysis of the system shown in FIG. 2.

First consider the modified version of the system shown in FIG. 9, where $\psi(t) = e'_{ISI}(t)$, $$e'_{ISI}(t) = \frac{1}{4}\sum_{i=1}^{36}p'_i[n_t]\eta_i(t), \quad (35)$$

$$p'_i[n] = \begin{cases} p_i[n], & \text{if } q_i[n] = 0, \\ 0, & \text{otherwise,} \end{cases} \quad (36)$$

and $$u_i[n] = \begin{cases} q_i[n], & \text{if } 1 \le i \le 36, \\ s_{i-36}[n], & \text{if } 37 \le i \le 71. \end{cases} \quad (37)$$

The system differs from that shown in FIG. 2 only in that $p_i[n+P-m]$ has been replaced by $q_i[n+P-m]$ for each $i\in\{1, 2, . . . , 36\}$ and $m\in\{0, 1, . . . , N-1\}$ in the 1-bit DAC ISI estimators, and $e'_{ISI}(t)$ has been explicitly subtracted from the DAC outputs. As explained in Section III-A, the main DEM DAC's output, $\gamma(t)$, contains the additive term, $e_{ISI}(t)$, given by (23), and (36), (37) and FIG. 9 imply that the correction DAC output, $y_c(t)$, is not a function of any of the $p'_i[n]$ sequences. Consequently, the explicit subtraction of $e'_{ISI}(t)$ in the system of FIG. 9 causes the system's output, $v(t)$, not to depend on any of the $p'_i[n]$ sequences and this implies that it is only necessary for the ISIC technique portion of the system to cancel $e_{ISI}(t)-e'_{ISI}(t)$. Directly subtracting $e'_{ISI}(t)$ is not a viable option in practice as it is not known a priori, but the analysis of the system of FIG. 9 is only an intermediate step toward the analysis of the system of FIG. 2, which is the ultimate objective of this section.

The following two theorems and two corollaries provide results that allow the results presented in [3] to be applied to the system shown in FIG. 9. The proofs of the theorems and corollaries are presented in the appendix.

Theorem 1: For the DEM DAC presented above, $$E\{p_i[m]q_{i'}[n]\} = \begin{cases} 1, & \text{if } i = i', m = n, q_{i'}[n] \neq 0, \\ 0, & \text{otherwise,} \end{cases} \quad (38)$$

for each i, $i'\in E\{1, 2, . . . , 36\}$ and any integers m and n.

Corollary 1: For the DEM DAC presented above, $q_i[n]=p_i[n]$ if $q_i[n]\neq 0$.

Corollary 2: For the DEM DAC presented above, $E\{p_i[m]s_{i'}[n]\}=0$ for each $i\in\{1, 2, \ldots, 36\}$, $i'\in\{1, 2, \ldots, 35\}$ and any integers m and n, where $s_{i'}[n]$ denotes $S_{k,r}[n]$ for any integers k and r.

Theorem 2: For the DEM DAC presented above and each pair of integers, m and n, the nonzero values of $s_{k,r}[m]$ and $q_i[n]$ for all i, k, and r are zero-mean independent random variables restricted to values of 1 and −1.

The analysis presented in [3] was originally intended to apply just to the MNC technique as it relies on specific properties of the $s_i[n]$ sequences. However, Theorems 1 and 2 and Corollary 1 together with (37) imply that the $u_i[n]$ sequences in the system of FIG. 9 also have these properties. Consequently, the results of [3] with the $u_i[n]$ sequences in place of the $s_i[n]$ sequences hold for the system of FIG. 9 even though it implements both the ISIC and MNC techniques. Specifically, the results ensure that for a sufficiently small accumulator gain, K, the expected values of the adaptive filter coefficients, denoted as $\bar{a}_{i,m}[n]$ for i=1, 2, \ldots, 71 and m=0, 1, \ldots, N−1, converge to the unique set of values that optimally cancel the first Nyquist band portions of both $e_{MM}(t)$ and $e_{ISI}(t)−e'_{ISI}(t)$ as n goes to infinity. The results also show that the convergence error is bounded by an exponentially decreasing function of n with a time constant that is proportional to 1/K.

It follows from (23), (35), (36), and Corollary 1 that $$e_{ISI}(t) - e'_{ISI}(t) = \frac{1}{4}\sum_{i=1}^{36} q_i(t)\eta_i(t). \qquad (39)$$

Therefore, the results derived above together with (39) imply that the expectation of the impulse response of the adaptive filter implemented by the ith error estimator in the system of FIG. 9 for each $i\in\{1, 2, \ldots, 36\}$ converges to the values $$h_i[m] = \begin{cases} \lim_{n\to\infty}\{\bar{a}_{i,m}[n]\}, & \text{if } 0 \leq m \leq N-1, \\ 0, & \text{otherwise}, \end{cases} \qquad (40)$$

that best cancel the ith term in (39). The continuous-time Fourier transform of the ith term of (39) can be written as $$\frac{1}{4}Q_i(e^{j\omega T_s})E_{p-i}(j\omega), \qquad (41)$$

where $Q_i(e^{j\omega})$ is the discrete-time Fourier transform of $q_i[n]$ and $E_{p-i}(j\omega)$ is the continuous-time Fourier transform of $$\eta_{i-p}(t) = \begin{cases} \eta_i(t), & \text{if } 0 \leq t \leq T_s, \\ 0, & \text{otherwise}, \end{cases} \qquad (42)$$

with $\eta_i(t)$ given by (20). In analogy with (14), the desired signal component of the correction DAC has the form $\alpha_c(t)x_c[n_r]$, where $\alpha_c(t)$ is a $T_s$-periodic function. The continuous-time Fourier transform of $\alpha_c(t)x_c[n_r]$ is $$X_c(e^{j\omega T_s})A_{p-c}(j\omega), \qquad (43)$$

where $A_{p-c}(j\omega)$ is the continuous-time Fourier transform of the right side of (42) with $\eta_i(t)$ replaced by $\alpha_c(t)$. The input to the adaptive filter in the ith error estimator in FIG. 9 for each $i\in\{1, 2, \ldots, 36\}$ is $q_i[n+P]$, so for the system of FIG. 9 to cancel the first Nyquist-band portion of (39) if follows that the adaptive filter in the ith error estimator for i=1, 2, \ldots, 36 must converge to have a frequency response that well-approximates $$H_i(e^{j\omega T_s}) = \frac{1}{4}e^{-j\omega P T_s}\frac{E_{p-i}(j\omega)}{A_{p-c}(j\omega)} \text{ for } |\omega| \leq \pi f_s. \qquad (44)$$

As the desired signal component of the correction DAC has the form $\alpha_c(t)x_c[n_r]$, the signal processing operations shown in FIG. 9 imply that setting $$\psi(t) = \alpha_c(t)\sum_{i=1}^{36}\sum_{m=0}^{N-1} p_i'[n_t + P - m]a_{i,m}[n_t], \qquad (45)$$

results in the same v(t) that would have occurred had the $u_i[n+P-m]$ sequences in the FIR filters been replaced by $p_i[n+P-m]$ for i=1, 2, \ldots, 36. Hence, the system of FIG. 9 with $\psi(t)$ given by (45) is equivalent to the system of FIG. 2.

As shown above, the results of [3] apply to the system of FIG. 9 with $\psi(t)=e'_{ISI}(t)$, and in this case, v(t), and, consequently, the input to the coefficient calculators, t[n], do not depend on any of the $p'_i[n]$ sequences. Changing the system by setting $\psi(t)$ to (45) has the effect of adding $$e'_{ISI}(t) - \psi(t) = \frac{1}{4}\sum_{i=1}^{36} p_i'[n_t]\eta_i(t) - \alpha_c(t)\sum_{i=1}^{36}\sum_{m=0}^{N-1} p_i'[n_t + P - m]a_{i,m}[n_t], \qquad (46)$$

to v(t), which causes v(t), and consequently, t[n], to depend on the $p'_i[n]$ sequences. In particular, it causes t[n] to contain an extra additive component that is linear combination of time shifted versions of the $p'_i[n]$ sequences.

The input to mth accumulator in the ith coefficient calculator is $t[n]u_i[n+P-Q-m]$ for each $i\in\{1, 2, \ldots, 71\}$ and m $\in\{0, 1, \ldots, N-1\}$. Theorem 1, Corollary 2, and (37) together imply that the expected value of $p'_k[n']u_i[n+P-Q-m]$ is zero regardless of k and n'. Therefore, the expected value of $t[n]u_i[n+P-Q-m]$ does not depend on the extra terms that are introduced into t[n] as a result of changing $\psi(t)$ to (45) instead of $\psi(t)=e'_{ISI}(t)$. As the results of [3] characterize the expected values of the accumulator outputs, and changing $\psi(t)$ to (45) does not change these expected values, the results of [3] must apply to the system of FIG. 9 with $\psi(t)$ given by (45). As this system is equivalent to the system of FIG. 2, the results must also apply to the system of FIG. 2.

This implies that the system of FIG. 2 cancels the first Nyquist-band portion of $e_{MM}(t)$, but the presence of the additive component in v(t) given by (46) implies that it only cancels the first Nyquist band portion of $e_{ISI}(t)−(e'_{ISI}(t)−\psi(t))$. Nevertheless, as shown next, this is not a problem because the first Nyquist-band portion of $e'_{ISI}(t)−\psi(t)$ is negligible once the adaptive filter coefficients have converged. Once the adaptive filters have converged to the point that their frequency responses well-approximate (44), the continuous-time Fourier transform of (46) is well-approximated as $$\sum_{i=1}^{36} P'_i\left(e^{j\omega T_s}\right)\left(\frac{1}{4}E_{p-i}(j\omega) - e^{j\omega PT_s}A_{p-c}(j\omega)H_i\left(e^{j\omega T_s}\right)\right). \tag{47}$$

Substituting (44) into (47) shows that (47) is zero for all $|\omega| \leq \pi f_s$. Hence, the first Nyquist-band portion of $e'_{ISI}(t) - \psi(t)$ well approximates zero once the adaptive filter coefficients have converged.

APPENDIX

This appendix contains proofs of the theorems and corollaries presented in Section IV.

Proof of Theorem 1: Equations (3) and (4) imply that $$x_i[n] = \frac{1}{\Delta}(m_i x[n] + \lambda_i[n]). \tag{48}$$

As proven in [6], $$\lambda_{2j-u}[n] = \frac{\Delta}{2}\left[s_{15-j,1}[n] + (-1)^{u+1} s_{1,j}[n]\right], \tag{49}$$

for $j \in \{1, 2, \ldots, 10\}$ and $u \in \{0,1\}$, and $$\lambda_{21+u'}[n] = -\frac{\Delta}{2}\sum_{j=0}^{9} s_{14-j,1}[n]2^{j-13} - \tag{50}$$

$$\frac{\Delta}{2}\left[(2w-1)s_{4,1}[n]2^{-3} + (2v-1)s_{3,w+1}[n]2^{-2} + \right.$$

$$\left. (2y-1)s_{2,2w+v+1}[n]2^{-1} + (2z-1)s_{1,11+4w+2v+\gamma}[n]\right],$$

for each u'=8w+4v+2y+z and w, v, y, z∈{0, 1}. It can be verified by enumeration that (50) is equivalent to $$\lambda_i[n] = \Delta\sum_{k=1}^{14} 2^{-k}(-1)^{m_{k,i}} s_{k,r_{k,i}}[n] \tag{51}$$

for each i∈{21, 22, ..., 36}, where $$m_{k,i} = \left\lfloor\frac{i+16347}{2^{k-1}}\right\rfloor \text{ and } r_{k,i} = \left\lfloor\frac{i-21}{2^k}\right\rfloor + \begin{cases} 11, & \text{if } k=1, \\ 1, & \text{otherwise.} \end{cases} \tag{52}$$

The definitions of $v_j[n]$, $w_j[n]$, and $q_{2j-u}[n]$ imply $$|v_j[n]| \in \{0, 1\}, \ |w_j[n]| \in \{0, 1\}, \text{ and } |q_{2j-u}[n]| \in \{0, 1\}, \tag{53}$$

for each n, j, and u by the following reasoning. The switching sequences have magnitudes restricted to 0 and 1 by definition, so (27) and (29) imply that $|v_j[n]| \in \{0,1\}$. Definition (28) implies that $w_j[n] \neq 0$ can only occur when $s'_j[n]=0$, which (29) implies occurs if $s_{1,j}[n]=0$ or $s_{1,j}[n-1]=0$. Therefore (28) and (30) imply that $|w_j[n]| \in \{0, 1\}$. As only one of $v_j[n]$ and $w_j[n]$ can be nonzero for any given values of j and n, it follows from (26) that $|q_{2j-u}[n]|$ ∈{0,1}. For each j∈{1, 2, ..., 10} and u∈{0, 1}, (7), (48), and (49) imply that $$x_{2j-u}[n] = \frac{1}{2}\left[s_{15-j,1}[n] + (-1)^{u+1} s_{1,j}[n]\right], \tag{54}$$

with which (24), (29), and (30) imply $$p_{2j-u}[n] = s_{15-j,1}[n]s_{15-j,1}[n-1] + s'_j[n] + (-1)^{u+1}s''_j[n]. \tag{55}$$

Equations (9) and (10) imply that when the input to the $S_{15-j,1}$ switching block is odd, $S_{15-j,1}[n]$, for each j=1, 2, ..., 10, is equal to zero, so the bottom output of the $S_{15-j,1}$ switching block, $c_{1,j}[n]$ is equal to one. In this case, (12) implies that $s_{1,j}[n]$ has a magnitude of one and a randomly-chosen sign. When the input to the $S_{15-j,1}$ switching block is even, (10) implies that $S_{15-j,1}[n]$ has a magnitude of one and a randomly chosen sign, which, with (9) and (12), further implies that $s_{1,j}[n]$ is equal to zero. Consequently, one of the terms on the right side of (54) is zero and the other term has a magnitude of one for each value of n, which further implies that only one of the terms on the right side of (55) is nonzero for any given values of n, j, and u. This with (27) and (28) implies that for each j∈{1, 2, ..., 10} and u∈{0, 1}

$$p_{2j-u}[n] = \begin{cases} v_j[n], & \text{if } v_j[n] \neq 0, \\ (-1)^{u+1}w_j[n], & \text{if } w_j[n] \neq 0, \end{cases} \tag{56}$$

By definition, the nonzero values of the $S_{k,r}[n]$ sequences are independent, zero-mean random variables restricted to values of 1 and −1, and (24), (48), (49), and (51), imply that $p_i[n]$ is independent of the nonzero values of $s_{1,j}[n]$ except when i=2j and i=2j−1. These observations with (53) and (56) imply that $$E\{p_i[m]v_j[n] \mid v_j[n] \neq 0\} = \begin{cases} 1, & \text{if } i=2j \text{ and } m=n, \\ 1, & \text{if } i=2j-1 \text{ and } m=n, \\ 0, & \text{otherwise,} \end{cases} \tag{57}$$

and $$E\{p_i[m]w_j[n] \mid w_j[n] \neq 0\} = \begin{cases} -1, & \text{if } i=2j \text{ and } m=n, \\ 1, & \text{if } i=2j-1 \text{ and } m=n, \\ 0, & \text{otherwise,} \end{cases} \tag{58}$$

for i=1, 2, ..., 36 and j=1, 2, ..., 10, where E{A|B} denotes the expectation of A given B.

For each i=21, 22, ..., 36, (48) and (7) imply that $$x_i[n] = \frac{1}{\Delta}(2^{-14}x[n] + \lambda_i[n]) \tag{59}$$

with $\lambda_i[n]$ given by (51). The DEM DAC input sequence, x[n], is restricted to the range {−8192Δ, −8191Δ, ..., 8192Δ} and, as proven in [6], the DEM encoder's operation ensures that $x_i[n]$ is restricted to values of −½ and ½, so (59) implies that $$x_i[n] = \begin{cases} 1/2 & \text{if } \lambda_i[n] > 0, \\ -1/2, & \text{if } \lambda_i[n] < 0. \end{cases} \tag{60}$$

Given that each $s_{k,r}[n]$ is restricted to values of $-1$, 0, and 1 by definition, the magnitude of the kth term in (51) is either zero or $\Delta 2^{-k}$ for k=1, 2, ..., 14. This implies that the sign of $\lambda_i[n]$ for each value of n is equal to the sign of the smallest-k term in (51) that is non-zero. For example, the sign of $\lambda_{23}[n]$ when $s_{1,12}[n] \neq 0$ is the sign of $s_{1,12}[n]$.

It follows from (51), (60), and the restriction by definition of the possible nonzero values of $s_{k,r}[n]$ to $-1$ and 1 that $$x_{2_{j-u}}[n] = \begin{cases} \dfrac{(-1)^{u+1}}{2} s_{1,j}[n], & \text{if } s_{1,j}[n] \neq 0, \\ \dfrac{(-1)^{j-1}}{2} s_{2,\lfloor \frac{j-9}{2} \rfloor}[n], & \text{if } s_{1,j}[n] = 0, s_{2,\lfloor \frac{j-9}{2} \rfloor}[n] \neq 0, \end{cases} \quad (61)$$

for j={11, 12, ..., 18} and u∈{0, 1}. Given that $w_j[n]$ can only be nonzero if $s_{1,j}[n]=0$ or $s_{1,j}[n-1]=0$ as explained above, it follows from (28) and (30) that $w_j[n]$ satisfies $$w_j[n] = (-1)^{j-1} s_{1,j}[n'] s_{2,\lfloor \frac{j-9}{2} \rfloor}[n''] \text{ if } w_j[n] \neq 0 \quad (62)$$

when j∈{11, 12, ..., 18}, where n'=n and n"=n−1 or vice versa. Therefore, (24), (27), (29), and (61) imply that (56) holds for each j∈{11, 12, ..., 18} and u∈{0, 1}. As the nonzero values of $s_{k,r}[n]$ are independent, zero-mean random variables for all k and r, and (24), (48), (49), and (51) imply that $p_i[n]$ is independent of the nonzero values of $s_{1,j}[n]$ except when i=2j and i=2j−1, it follows that (57) and (58) hold for i=1, 2, ..., 36 and j=11, 12, ..., 18 in addition to j=1, 2, ..., 10.

By definition, $v_j[n]$ and $w_j[n]$ are functions of switching sequences so they are random variables, and whenever one of $v_j[n]$ and $w_j[n]$ is nonzero, the other is zero. Furthermore, as proven above, $v_j[n]$ and $w_j[n]$ are each restricted to values of $-1$, 0, and 1. It follows from (31) that $u_j[n]=0$ whenever $v_j[m]$ and $w_j[m]$ have been nonzero the same number of times over m=0, 1, ..., n−1. Hence, definitions (27) and (28) ensure that $\Pr\{v_j[n] \neq 0\}=\Pr\{w_j[n] \neq 0\}$, so (26) and (53) further imply that $\Pr\{q_{2j-u}[n]=v_j[n]|q_{2j-u}[n] \neq 0\}=\Pr\{q_{2j-u}[n]=-(-1)^u w_j[n]|q_{2j-u}[n] \neq 0\}=\frac{1}{2}$. This, (57), and (58) imply that $$E\{p_j[m]q_{2j-u}[n]\} = \begin{cases} 1, & \text{if } i = 2j - u, m = n, q_{2j-u}[n] \neq 0, \\ 0, & \text{otherwise} \end{cases} \quad (63)$$

for each i∈{1, 2, ..., 36}, j∈{1, 2, ..., 18}, and u∈{0, 1}, which is equivalent to (38).

Proof of Corollary 1: Definitions (27) and (28) imply that only one of $v_j[n]$ and $w_j[n]$ can be nonzero for any given values of j and n. Therefore, (26) implies that $q_{2j-u}[n]$ is equal to the right side of (56) for each j∈{1, 2, ..., 18}, and u∈{0,1}.

Proof of Corollary 2: As shown in the proof of Theorem 1, (55) holds for each j∈{1, 2, ..., 10} and u∈{0, 1}. Equations (29) and (30) imply that each nonzero term in (55) has the form $s_{i''}[n]s_{i'''}[n-1]$ or $-s_{i''}[n]s_{i'''}[n-1]$ for some integers i" and i'''. As also shown in the proof of Theorem 1, $x_i[n]$, which has a magnitude of ½, has the sign of the smallest-k term in (51) that is non-zero for i=21, 22, ..., 36. Therefore, (24) implies that $p_i[n]$ has the form $s_{i''}[n]s_{i'''}[n-1]$ or $-s_{i''}[n]s_{i'''}[n-1]$ for i=21, 22, ..., 36 and some integers i" and i'''. Corollary 2 follows from these observations because the nonzero values of the switching sequences, $s_{i'}[n]$, are independent zero-mean random variables.

Proof of Theorem 2: The nonzero values of $s_{k,r}[m]$ are zero mean random variables restricted to values of 1 and $-1$ by definition. As shown in the proof of Theorem 1, the nonzero values of $q_i[n]$ are also zero-mean random variables restricted to values of 1 and $-1$. Therefore, it remains to show that the elements of the set $$A = \left\{ s_{k,r}[m] \neq 0, q_i[n] \neq 0 : k = 1, \dots 14, r = 1, \dots 18, i = 1, \dots 36 \right\} \quad (64)$$

are independent random variables for each m and n.

As each element of A is restricted to values of 1 and $-1$ and is zero mean, its probability mass function is equal to ½ for each of its two possible values. Therefore, to show that the elements of A are independent, it is necessary to show that the joint probability mass function of the elements of A can be written as $$p_A(a_1, a_2, \dots, a_M) = \frac{1}{2^M}, \quad (65)$$

where each $a_i \in \{-1, 1\}$ and M is the number of elements in A.

If none of the elements of A are $q_i[n]$ for some i∈{1, 2, ..., 36}, then each element of A is $s_{k,r}[m]$ for some k and r. In this case, the elements of A are independent random variables by definition.

Otherwise, A must contain the element $q_{2j-u}[n]$ for some j∈{1, 2, ..., 18} and u∈{0, 1}. Without loss of generality, suppose that $q_{2j-u}[n]$ is the first element of A, and let B be the set of all the elements of A except $q_{2j-u}[n]$, i.e., B=A/$\{q_{2j-u}[n]\}$. Then $$p_A(a_1, a_2, \dots, a_M) = p_{q|B}(a_1 | a_2, \dots, a_M) p_B(a_2, \dots, a_M), \quad (66)$$

where $p_{q|B}(a_1|a_2, \dots, a_M)$ is the probability mass function of $q_{2j-u}[n]$ given the values of the elements in B, and $p_B(a_2, \dots, a_M)$ is the joint probability mass function of the elements of B. Equations (26)-(31) imply that each nonzero value of $q_{2j-u}[n]$ has the form $s_{k',r'}[n]s_{k'',r''}[n-1]$ for specific values of k', r', k", and r", and, by definition, the nonzero values of $s_{k,r}[m]$ for all k, r, and m are independent random variables. These observations are used in the following.

First suppose that j∈{1, 2, ..., 10} and $q_{2j-1+u}[n] \notin B$. Equations (26)-(31) imply that if m≠n then B does not contain any elements that depend on $s_{k',r'}[n]$ and if m≠n−1 then B does not contain any elements that depend on $s_{k'',r''}[n-1]$. If m≠n and m≠n−1, it follows that $q_{2j-u}[n]$ is independent of the elements in B. If m=n, then regardless of the values taken on by the elements in B, it follows that $s_{k'',r''}[n-1]$ has an equal chance of being 1 or $-1$, so the same is true of $s_{k',r'}[n]s_{k'',r''}[n-1]$, and, hence, $q_{2j-u}[n]$. Similarly, if m=n−1, then $s_{k',r'}[n]s_{k'',r''}[n-1]$, and, hence, $q_{2j-u}[n]$ have an equal chance of being 1 or $-1$ regardless of the values taken on by the elements in B. Consequently, $$p_A(a_1, a_2, \dots, a_M) = \frac{1}{2} p_B(a_2, \dots, a_M). \quad (67)$$

Now suppose that j∈{1, 2, ..., 10} and $q_{2j-1+u}[n] \in B$. As shown in the proof of Theorem 1, when $q_{2j-1+u}[n]$ is nonzero the probability that $|v_j[n]|=1$ and $w_j[n]=0$ is ½ and the probability that $v_j[n]=0$ and $|w_j[n]|=1$ is ½. Given that $q_{2j-1+u}[n] \in$ B, it is nonzero, so (26) implies that $q_{2j-u}[n]=q_{2j-1+u}[n]=v_j[n]$ with a probability of ½ and $q_{2j-u}[n]=-q_{2j-1+u}[n]=w_j[n]$ with a probability of ½ regardless of whether $q_{2j-1+u}[n]$ is 1 or −1 and regardless of the values of the other elements in B. Therefore, the argument presented above which led to (67) shows that (67) also holds when $j \in \{1, 2, \ldots, 10\}$ and $q_{2j-1+u}[n] \in$ B.

Now suppose that $j \in \{11, 12, \ldots, 18\}$. In this case, (26)-(31) imply that $q_{2j'-1}[n]$, $q_{2j'}[n]$, $q_{2j'+1}[n]$, and $q_{2j'+2}[n]$ in general depend on $s_{2\lfloor(j'-9)/2\rfloor}[n']$ for each odd value of j' where n'=n or n'=n−1, whereas none of the other nonzero $q_i[n]$ depend on $s_{2\lfloor(j'-9)/2\rfloor}[n']$. For any given value of n and any odd value of j', (26)-(31) imply that $q_{2j'-1}[n]$ and $q_{2j'}[n]$ only depend on $s_{2\lfloor(j'-9)/2\rfloor}[n']$ when $w_{j'}[n]$ is nonzero and $s_{2\lfloor(j'-9)/2\rfloor}[n']s_{1,j'}[n'']$ is nonzero, where n'=n and n''=n−1 or vice versa. The DEM encoder results presented in [7] imply that the input to the $s_{2\lfloor(j'-9)/2\rfloor}$ switching block is restricted to values of 0, 1, 2, 3, and 4. Therefore, when $s_{2\lfloor(j'-9)/2\rfloor}[n']$ is nonzero, (11) and (12) imply that the top and bottom outputs of the $s_{2\lfloor(j'-9)/2\rfloor}$ switching block are respectively 1 and 0, or 0 and 1, or 2 and 1, or 1 and 2. However, (12) implies that $s_{1,j'}[n'']$ can only be nonzero if the top and bottom outputs of the $s_{2\lfloor(j'-9)/2\rfloor}$ switching block are even and odd, respectively. In this case, (12) implies that $s_{1,j'+1}[n'']=0$. This shows that for any n and any odd j', if $q_{2j'-1}[n]$ and $q_{2j'}[n]$ depend on $s_{2\lfloor(j'-9)/2\rfloor}[n']$, then $q_{2j'+1}[n]$, and $q_{2j'+2}[n]$ do not depend on $s_{2\lfloor(j'-9)/2\rfloor}[n']$. A nearly identical argument shows that if for any n and any odd j', if $q_{2j'+1}[n]$, and $q_{2j'+2}[n]$ depend on $s_{2\lfloor(j'-9)/2\rfloor}[n']$, then $q_{2j'-1}[n]$ and $q_{2j'}[n]$ do not depend on $s_{2\lfloor(j'-9)/2\rfloor}[n']$. These results and the reasoning which led to (67) for the cases where $j \in \{1, 2, \ldots, 10\}$ show that (67) also holds when $j \in \{11, 12, \ldots, 18\}$.

The above reasoning can be applied recursively with set $A^{(h)}$ in place of set A, set $B^{(h)}$ in place of set B, $M^{(h)}$ in place of M, $A^{(1)}$ defined as (64), and $A^{(h)}=B^{(h-1)}$ for h>1. Doing so for h=1, 2, ..., H, where H is the smallest integer such that each element of $B^{(H)}$ is $s_{k,r}[n]$ for some k and r, leads to $$p_A(a_1, a_2, \ldots, a_M) = \frac{1}{2^H} p_{B^{(H)}}(a_H, a_{H+1}, \ldots, a_M). \quad (68)$$

By definition, the elements of B (H) are distinct, non-zero $s_{k,r}[n]$ values, so they are all zero-mean independent random variables that each take on values of 1 and −1 with equal probability.

Consequently, $$p_{B^{(H)}}(a_H, a_{H+1}, \ldots, a_M) = \frac{1}{2^{M-H}} \quad (69)$$

which, with (68), yields (65).

REFERENCES

[1] J. Remple and I. Galton, "The Effects of Inter-Symbol Interference in Dynamic Element Matching DACs," IEEE Transactions on Circuits and Systems I: Regular Papers, vol. 64, no. 1, pp. 14-23, January 2017.

[2] J. Remple, A. Panigada, and I. Galton, "An ISI Scrambling Technique for Dynamic Element Matching Current-Steering DACs," IEEE Journal of Solid State-Circuits, vol. 57, no. 2, pp. 465-479, February 2022.

[3] D. Kong and I. Galton, "Subsampling Mismatch Noise Cancellation for High-Speed Continuous-Time DACs," IEEE Transactions on Circuits and Systems I: Regular Papers, vol. 66, no. 8, pp. 2843-2853 August 2019.

[4] D. Kong and I. Galton, "Adaptive Cancellation of Static and Dynamic Mismatch Error in Continuous-Time DACs," IEEE Transactions on Circuits and Systems I: Regular Papers, vol. 65, no. 2, pp. 421-433, February 2018.

[5] D. Kong, K. Rivas-Rivera and I. Galton, "A 600 MS/s DAC with over 87 dB SFDR and 77 dB peak SNDR Enabled by Adaptive Cancellation of Static and Dynamic Mismatch Error," IEEE Journal of Solid-State Circuits, vol. 54, no. 8, pp. 2219-2229 August 2019.

[6] K. L. Chan, J. Zhu, and I. Galton, "Dynamic Element Matching to Prevent Nonlinear Distortion From Pulse-Shape Mismatches in High-Resolution DACs," IEEE Journal of Solid-State Circuits, vol. 43, no. 9, pp. 2067-278 September 2008.

[7] L. Chan, N. Rakuljic, and I. Galton, "Segmented Dynamic Element Matching for High-Resolution Digital-to-Analog Conversion," IEEE Transactions on Circuits and Systems I: Regular Papers, vol. 55, no. 11, pp. 3383-3392 December 2008.

Terminology

Although this disclosure has been described in the context of certain embodiments and examples, it will be understood by those skilled in the art that the disclosure extends beyond the specifically disclosed embodiments to other alternative embodiments and/or uses and obvious modifications and equivalents thereof. In addition, while several variations of the embodiments of the disclosure have been shown and described in detail, other modifications, which are within the scope of this disclosure, will be readily apparent to those of skill in the art. It is also contemplated that various combinations or sub-combinations of the specific features and aspects of the embodiments may be made and still fall within the scope of the disclosure. For example, features described above in connection with one embodiment can be used with a different embodiment described herein and the combination still fall within the scope of the disclosure. It should be understood that various features and aspects of the disclosed embodiments can be combined with, or substituted for, one another in order to form varying modes of the embodiments of the disclosure. Thus, it is intended that the scope of the disclosure herein should not be limited by the particular embodiments described above. Accordingly, unless otherwise stated, or unless clearly incompatible, each embodiment of this invention may include, additional to its essential features described herein, one or more features as described herein from each other embodiment of the invention disclosed herein.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, 0.1 degree, or otherwise.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A digital-to-analog conversion system configured to reduce inter-symbol interference (ISI), the digital-to-analog conversion system comprising:

a main digital-to-analog converter (DAC) comprising a plurality of sub-DACs, each sub-DAC configured to receive a respective portion of a digital input sequence and generate a respective portion of an output waveform of the main DAC, wherein each sub-DAC has unique characteristics that introduce ISI error in the output waveform; and an ISI mitigation feedback loop configured to adaptively at least partially cancel the ISI error in the output waveform introduced by the sub-DACs, the ISI mitigation feedback loop comprising:

an analog-to-digital converter (ADC) configured to generate a digital sequence based on the output waveform of the main DAC and an analog correction signal generated by a correction DAC;

a fractional decimation filter configured to process the digital sequence by modifying a sampling rate and attenuating high-frequency components;

a digital error estimator configured to provide an error cancellation sequence, the digital error estimator comprising an ISI estimator, the ISI estimator comprising a plurality of sub-ISI estimators, wherein outputs of the plurality of sub-ISI estimators are combined to form an output of the ISI estimator, wherein each sub-ISI estimator is configured to:

generate first and second digital encoder information sequences comprising a plurality of values, wherein each value of each sequence is derived from a state of a digital encoder of the main DAC, and wherein the first and second digital encoder information sequences correspond to activity and timing of the sub-DACs, correlate the first digital encoder information sequence against a digital input sequence provided to the ISI estimator, to estimate impulse response coefficients for a subsequent finite impulse response (FIR) filter, and perform FIR filtering on the second digital encoder information sequence using the impulse response coefficients; and the correction DAC configured to receive the error cancellation sequence from the digital error estimator and generate the analog correction signal, wherein the analog correction signal corresponds to ISI error components.

2. The digital-to-analog conversion system of claim 1, wherein the digital encoder is a dynamic element matching (DEM) encoder.

3. The digital-to-analog conversion system of claim 2, wherein the DEM encoder generates digital switching sequences that correspond to activity and timing of the sub-DACs, and wherein the first digital encoder information sequence is derived from the digital switching sequences.

4. The digital-to-analog conversion system of claim 1, wherein to estimate the impulse response coefficients, each sub-ISI estimator is further configured to correlate one or more delayed versions of the first digital encoder information sequence against the digital input sequence provided to the ISI estimator.

5. The digital-to-analog conversion system of claim 1, wherein the digital error estimator further comprises a mismatch error estimator configured to reduce static and/or dynamic error arising from undesired deviations from nominal component characteristics and clock skew, wherein the ISI estimator and the mismatch error estimator are configured to operate concurrently and share analog circuitry without significant mutual interference.

6. The digital-to-analog conversion system of claim 1, wherein each of the sub-DACs is a 1-bit DAC.

7. The digital-to-analog conversion system of claim 1, wherein the ISI mitigation feedback loop is configured to at least partially cancel the ISI error components, and wherein the ISI error components are within a first Nyquist band of the DAC.

8. The digital-to-analog conversion system of claim 1, wherein the ISI mitigation feedback loop is configured to perform foreground calibration during an initialization phase, the foreground calibration comprising applying a predetermined input sequence to the main DAC to expedite convergence of adaptive FIR filter coefficients before transitioning to normal operation.

9. The digital-to-analog conversion system of claim 1, wherein the ISI mitigation feedback loop is configured to perform background calibration during normal operation to adjust adaptive FIR filter coefficients in real-time to compensate for variations in temperature and other environmental conditions.

10. The digital-to-analog conversion system of claim 1, wherein each sub-ISI estimator is configured to receive a current digital input value and a previous digital input value provided to the respective sub-DAC, and to generate the second digital encoder information sequence by calculating a product of the current digital input value with the previous digital input value.

11. The digital-to-analog conversion system of claim 1, wherein each sub-ISI estimator is configured to generate the first digital encoder information sequence by processing switching sequences generated by the digital encoder, wherein the switching sequences correspond to operational states of the respective sub-DACs and are combined to form the first digital encoder information sequence.

12. A method for reducing inter-symbol interference (ISI) in a digital-to-analog conversion system, the method comprising:

receiving, at a main digital-to-analog converter (DAC) comprising a plurality of sub-DACs, a digital input sequence, each sub-DAC configured to receive a respective portion of the digital input sequence and generate a respective portion of an output waveform of the main DAC, wherein each sub-DAC has unique characteristics that introduce ISI error in the output waveform;

generating an error cancellation sequence using a digital error estimator, wherein the generating comprises:

generating first and second digital encoder information sequences, each comprising a plurality of values derived from a state of a digital encoder within the main DAC, wherein the first and second digital encoder information sequences correspond to activity and timing of the sub-DACs, correlating the first digital encoder information sequence against the digital input sequence to estimate impulse response coefficients for a subsequent finite impulse response (FIR) filter, and performing FIR filtering on the second digital encoder information sequence using the impulse response coefficients to generate the error cancellation sequence;

generating, based on the error cancellation sequence, an analog correction signal that corresponds to ISI error components; and generating a digital sequence using an analog-to-digital converter (ADC) based on the analog correction signal and the output waveform of the main DAC.

13. The method of claim 12, wherein the digital encoder is a dynamic element matching (DEM) encoder, wherein the DEM encoder generates switching sequences that correspond to activity and timing of the sub-DACs, and wherein each of the first and second digital encoder information sequences is derived from the switching sequences.

14. The method of claim 12, wherein estimating the impulse response coefficients comprises correlating one or more delayed versions of the first digital encoder information sequence against the digital input sequence.

15. The method of claim 12, wherein each of the sub-DACs is a 1-bit DAC.

16. The method of claim 12, further comprising performing a foreground calibration during an initialization phase, the foreground calibration comprising applying a predetermined input sequence to the main DAC to expedite convergence of adaptive finite impulse response (FIR) filter coefficients before transitioning to normal operation.

17. The method of claim 12, further comprising performing a background calibration during normal operation, the background calibration comprising adjusting the adaptive finite impulse response (FIR) filter coefficients in real-time to compensate for variations in temperature and other environmental conditions.

18. The method of claim 12, further comprising receiving, at each sub-ISI estimator, a current digital input value and a previous digital input value provided to the respective sub-DAC, and generating the second digital encoder information sequence by calculating a product of the current digital input value with the previous digital input value.

19. The method of claim 12, further comprising generating the first digital encoder information sequence by processing switching sequences generated by the digital encoder, wherein the switching sequences correspond to operational states of the respective sub-DACs and are combined to form the first digital encoder information sequence.

20. A digital-to-analog conversion system configured to reduce inter-symbol interference (ISI) in a main digital-to-analog converter (DAC), the digital-to-analog conversion system comprising:

an ISI mitigation feedback loop configured to adaptively at least partially cancel ISI error in an output waveform of the main DAC, wherein the main DAC comprises a plurality of sub-DACs, each sub-DAC configured to receive a respective portion of a digital input sequence and generate a respective portion of the output waveform, wherein each sub-DAC has unique characteristics that introduce the ISI error in the output waveform, and wherein the ISI mitigation feedback loop comprises:

an analog-to-digital converter (ADC) configured to generate a digital sequence based on the output waveform of the main DAC and an analog correction signal generated by a correction DAC;

a fractional decimation filter configured to process the digital sequence by modifying a sampling rate and attenuating high-frequency components;

a digital error estimator configured to provide an error cancellation sequence, the digital error estimator comprising an ISI estimator, the ISI estimator comprising a plurality of sub-ISI estimators, wherein outputs of the plurality of sub-ISI estimators are combined to form an output of the ISI estimator, wherein each sub-ISI estimator is configured to:

generate first and second digital encoder information sequences comprising a plurality of values, wherein each value of each sequence is derived from a state of a digital encoder of the main DAC, and wherein the first and second digital encoder information sequences correspond to activity and timing of the sub-DACs, correlate the first digital encoder information sequence against a digital input sequence provided to the ISI estimator, to estimate impulse response coefficients for a subsequent finite impulse response (FIR) filter, and perform FIR filtering on the second digital encoder information sequence using the impulse response coefficients; and the correction DAC configured to receive the error cancellation sequence from the digital error estimator and generate the analog correction signal, wherein the analog correction signal corresponds to ISI error components.

* * * * *